(12) United States Patent
Saruwatari

(10) Patent No.: US 10,600,827 B2
(45) Date of Patent: Mar. 24, 2020

(54) IMAGE SENSOR AND IMAGE-CAPTURING DEVICE

(71) Applicant: NIKON CORPORATION, Tokyo (JP)

(72) Inventor: Osamu Saruwatari, Yokohama (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 15/764,760

(22) PCT Filed: Sep. 28, 2016

(86) PCT No.: PCT/JP2016/078593
§ 371 (c)(1),
(2) Date: Mar. 29, 2018

(87) PCT Pub. No.: WO2017/057444
PCT Pub. Date: Apr. 6, 2017

(65) Prior Publication Data
US 2018/0288348 A1    Oct. 4, 2018

(30) Foreign Application Priority Data

Sep. 30, 2015 (JP) ................................ 2015-195348

(51) Int. Cl.
*H01L 27/146* (2006.01)
*H01L 27/088* (2006.01)
(Continued)

(52) U.S. Cl.
CPC ........... *H01L 27/14609* (2013.01); *H01L 21/823487* (2013.01); *H01L 27/088* (2013.01);
(Continued)

(58) Field of Classification Search
CPC ...... H04N 5/374; H04N 5/3745; H04N 5/378; H01L 27/146; H01L 27/14601;
(Continued)

(56) References Cited

U.S. PATENT DOCUMENTS 9,406,713 B2 * 8/2016 Fan ................... H01L 27/14643
9,992,437 B1 * 6/2018 Keung ................... H04N 5/374
(Continued)

FOREIGN PATENT DOCUMENTS

JP    2012-15274 A    1/2012
JP    5547260 B2    7/2014
(Continued)

OTHER PUBLICATIONS

Dec. 20, 2016 Search Report issued in International Patent Application No. PCT/JP2016/078593.
(Continued)

Primary Examiner — Lin Ye
Assistant Examiner — Chriss S Yoder, III
(74) Attorney, Agent, or Firm — Oliff PLC

(57) ABSTRACT

An image sensor includes: an accumulation unit that accumulates an electric charge generated by a photoelectric conversion unit that photoelectrically converts incident light transmitted through a microlens; and a readout unit that reads out a signal based on a voltage of the accumulation unit, wherein the accumulation unit and the readout unit are included along an optical axis direction of the microlens.

13 Claims, 16 Drawing Sheets

(51) Int. Cl.
  *H01L 21/8234* (2006.01)
  *H04N 5/378* (2011.01)
(52) U.S. Cl.
  CPC .. *H01L 27/14612* (2013.01); *H01L 27/14623* (2013.01); *H01L 27/14627* (2013.01); *H01L 27/14629* (2013.01); *H01L 27/14634* (2013.01); *H01L 27/14689* (2013.01); *H04N 5/378* (2013.01); *H01L 27/1469* (2013.01); *H01L 27/14643* (2013.01)
(58) Field of Classification Search
  CPC ......... H01L 27/14603; H01L 27/14609; H01L 27/1461; H01L 27/14612; H01L 27/14614; H01L 27/14623; H01L 27/14627; H01L 27/14638; H01L 27/14643
  See application file for complete search history.

(56) References Cited

U.S. PATENT DOCUMENTS

| | | | |
|---|---|---|---|
| 10,043,838 B2* | 8/2018 | Kwag | ............... H01L 27/14616 |
| 2010/0230729 A1 | 9/2010 | Ellis-Monaghan et al. | |
| 2011/0155893 A1 | 6/2011 | Endo et al. | |
| 2012/0188397 A1 | 7/2012 | Ohta | |
| 2013/0099291 A1 | 4/2013 | Shimotsusa et al. | |
| 2014/0211056 A1 | 7/2014 | Fan | |
| 2015/0029374 A1 | 1/2015 | Kitano | |
| 2015/0035028 A1* | 2/2015 | Fan | ................... H01L 27/14623 257/292 |
| 2015/0077606 A1 | 3/2015 | Ontsuki et al. | |
| 2015/0129943 A1 | 5/2015 | Kato et al. | |

FOREIGN PATENT DOCUMENTS

| | | |
|---|---|---|
| WO | 2011/077580 A1 | 6/2011 |
| WO | 2013/065569 A1 | 5/2013 |
| WO | 2014/002420 A1 | 1/2014 |
| WO | 2014/120447 A1 | 8/2014 |

OTHER PUBLICATIONS

Jul. 2, 2019 Search Report issued in European Patent Application No. 16851615.1.

Apr. 16, 2019 Office Action issued in Japanese Patent Application No. 2017-543476.

Aug. 9, 2019 Office Action issued in Korean Patent Application No. 10-2018-7008397.

Nov. 4, 2019 Extended Search Report issued in European Patent Application No. 16851615.1.

* cited by examiner (5) APPLYING SUPPORTING SUBSTRATE ON SUBSTRATE SURFACE AND POLISHING BACK SURFACE (7) FORMING OVERALL SHAPE BY ETCHING (6) FORMING PD SHAPE BY ETCHING (8) FORMING GATE OXIDE FILM (a) (9) FORMING NITRIDE FILM (c) (11) FORMING OXIDE FILM, CMP (b) (10) PATTERNING & ETCHING (d) (12) ETCHING OXIDE FILM

(13) DEPOSITING POLYSILICON (a)

(14) PATTERNING & ETCHING (b)

(15) FORMING OXIDE FILM
FORMING OXIDE FILM IN THE SAME STEPS AS IN (11) TO (12)

(c)

(16) FORMING WIRING
FORMING WIRING BY STEPS IN (13) TO (14) WITH METAL (d)

(21) FORMING GATE, METAL, OXIDE FILM REPEATING THE SAME STEPS AS IN (13) TO (16)

(a)

(22) ETCHING OXIDE FILM (b)

(23) VAPOR DEPOSITING LIGHT SHIELDING METAL (c)

(24) ETCHING LIGHT SHIELDING METAL (d)

(25) FORMING OXIDE FILM (a)

(26) FORMING WIRING ON SUBSTRATE FRONT SURFACE SIDE (FINISHED)

(b)

SUBSTRATE FRONT SURFACE SIDE (a)

(b)

(a) ETCHING BACK INTERLAYER FILM (b) SEQUENTIALLY ETCHING INTERLAYER FILM BY ISOTROPIC DRY ETCHING (c) DEPOSITING THIN NITRIDE FILM (d) COATING AND CURING THIN SOG (SPIN ON GLASS:SiO-BASED)

(a) PATTERNING SOG (SPIN ON GLASS:SiO-BASED)

(b) PATTERNING PHOTORESIST (PR)

(c) ETCHING SOG (d) REMOVING NITRIDE FILM AND THEN GATE OXIDE FILM BY ETCHING (a) REMOVING PR AND THEN PATTERNING PR FOR FORMING VIA (b)

(c) REMOVING PR AND THEN FORMING VIA (W DEPOSITING, ETCHING BACK)

(d)

IMAGE SENSOR AND IMAGE-CAPTURING DEVICE

TECHNICAL FIELD

The present invention relates to an image sensor and an image-capturing device.

BACKGROUND ART

PTL1 discloses the following solid-state image sensor. A semiconductor substrate is provided with an image-capturing region including a photoelectric conversion unit and a signal scan circuit unit and having unit pixels arranged in a matrix. The image-capturing region includes an field isolation insulating film that is provided to correspond to a boundary part between adjacent unit pixels and surround each unit pixel; a MOSFET provided on a front surface of the semiconductor substrate and in a region below the field isolation insulating film; and a first diffusion layer having a first conductivity type provided in a region in the vicinity of the field isolation insulating film in the semiconductor substrate. The field isolation insulating film is provided in the semiconductor substrate at an offset from the front surface of the semiconductor substrate on which the signal scan circuit unit is formed, and reaches a back surface of the semiconductor substrate. The MOSFET includes a gate electrode and a second diffusion layer having the first conductivity type formed in the semiconductor substrate and above the gate electrode. The first diffusion layer and the second diffusion layer contact each other. In a vertical direction of the semiconductor substrate, the center of the width of the first diffusion layer along a first direction orthogonal to the vertical direction is located in the vicinity of the center of the width of the second diffusion layer along the first direction.

CITATION LIST

Patent Literature

PTL1: Japanese Patent No. 5547260

SUMMARY OF INVENTION

There has been a recent trend toward solid-state image sensors having an increased number of pixels. In conventional solid-state image sensors, however, the increased number of pixels leads to a smaller light receiving area because a first diffusion layer and a second diffusion layer are arranged along a surface of a semiconductor substrate. As the light receiving area is reduced, the amount of electric charge generated by photoelectric conversion decreases, which can lead to a deterioration in the sensitivity.

According to the first aspect of the present invention, an image sensor comprises: an accumulation unit that accumulates an electric charge generated by a photoelectric conversion unit that photoelectrically converts incident light transmitted through a microlens; and a readout unit that reads out a signal based on a voltage of the accumulation unit. The accumulation unit and the readout unit are provided along an optical axis direction of the microlens.

According to the second aspect of the present invention, an image sensor comprises: a first surface and a second surface that intersect an optical axis of a microlens; an accumulation unit, located between the first surface and the second surface, that accumulates an electric charge generated by a photoelectric conversion unit that photoelectrically converts incident light transmitted through the microlens, a readout unit that reads out a signal based on a voltage of the accumulation unit, and an output unit that outputs the signal based on the voltage of the accumulation unit to the readout unit, wherein: with respect to a direction of an optical axis of the microlens, the accumulation unit is provided on the first surface side, the readout unit is provided on the second surface side, and the output unit is provided between the accumulation unit and the readout unit.

According to the third aspect of the present invention, an image-capturing device comprises: an image sensor and a generation unit that generates image data based on a signal outputted from the image sensor. The image sensor comprises: an accumulation unit that accumulates an electric charge generated by a photoelectric conversion unit that photoelectrically converts incident light transmitted through the microlens, and a readout unit that reads out a signal based on a voltage of the accumulation unit. The accumulation unit and the readout unit are arranged along an optical axis direction of the microlens.

DESCRIPTION OF EMBODIMENTS

First Embodiment

Schematic Element Configuration

Figure 1:
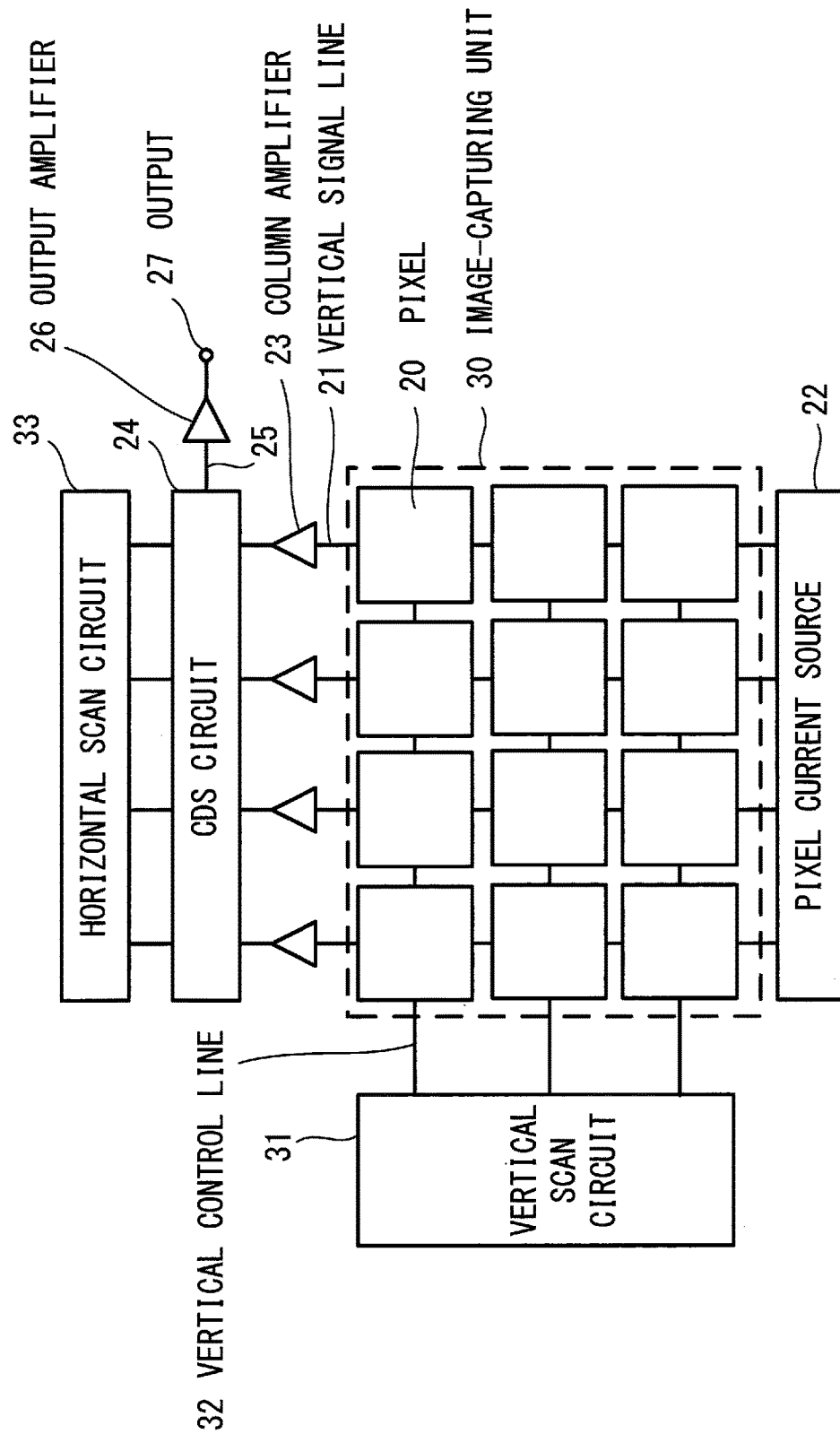
FIG. 1 is a view illustrating a schematic configuration of a solid-state image sensor 100 according to a first embodiment.

FIG. 1 is a view illustrating a schematic configuration of a solid-state image sensor 100 according to a first embodiment.

The solid-state image sensor 100 includes an image-capturing unit 30 having pixels 20 arranged on a light receiving surface. The pixels 20 are supplied with drive signals from a vertical scan circuit 31 via vertical control lines 32. Further, the pixels 20 are connected to vertical signal lines 21 on a column basis. The vertical signal lines 21 are connected to a pixel current source 22.

Furthermore, noise outputs and signal outputs that are time-divisionally outputted from the pixels 20 to the vertical signal lines 21 are sequentially inputted to a CDS circuit (a correlated double sampling circuit) 24 via column amplifiers 23. The CDS circuit 24 calculates a difference between both outputs to generate a true signal output. This true signal output is horizontally scanned by a drive signal from a horizontal scan circuit 33 and sequentially outputted to a horizontal signal line 25. A signal output of the horizontal signal line 25 is outputted to an output terminal 27 via an output amplifier 26.

Equivalent Circuit of Pixel 20

Figure 2:
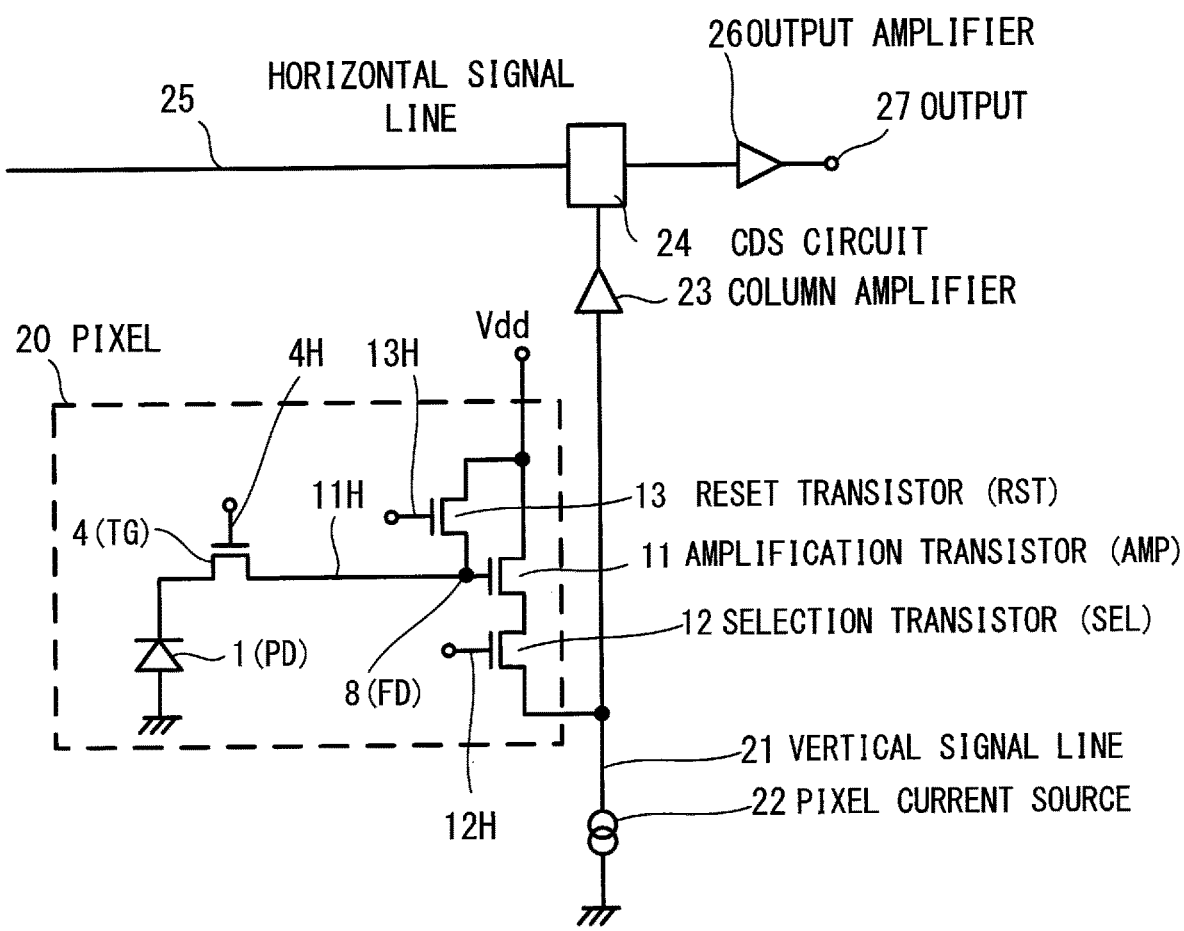
FIG. 2 is a view illustrating an equivalent circuit of a pixel 20 of the first embodiment.

FIG. 2 is a view illustrating an equivalent circuit of the pixel 20 described above.

The pixel 20 is provided with a photodiode (PD) 1. The PD 1 is connected to a floating diffusion (FD) 8 via a transfer transistor (TG: hereinafter also referred to as a transfer gate) 4 which is gate-controlled by a transfer drive signal (a transfer gate voltage). The FD 8 is connected to a gate electrode of an amplification transistor (AMP) 11. The FD 8 is also connected to a predetermined potential (e.g., a reference potential Vdd) via a reset transistor (RST: hereinafter also referred to as a reset gate) 13 which is gate-controlled by a reset drive signal (a reset gate voltage). The amplification transistor 11 has a drain connected to the potential Vdd and a source connected to the vertical signal line 21 via a selection transistor (SEL: hereinafter also referred to as a selection gate) 12 which is gate-controlled by a selection drive signal (a selection gate voltage).

The transfer gate voltage of the transfer transistor 4 is supplied via a transfer wiring 4H. The reset gate voltage of the reset transistor 13 is supplied via a reset wiring 13H. The selection gate voltage of the selection transistor 12 is supplied via a selection wiring 12H.

Other configurations are the same as those in FIG. 1 and repetitive description thereof will thus be omitted herein.

Element Structure of Pixel 20

Figure 3:
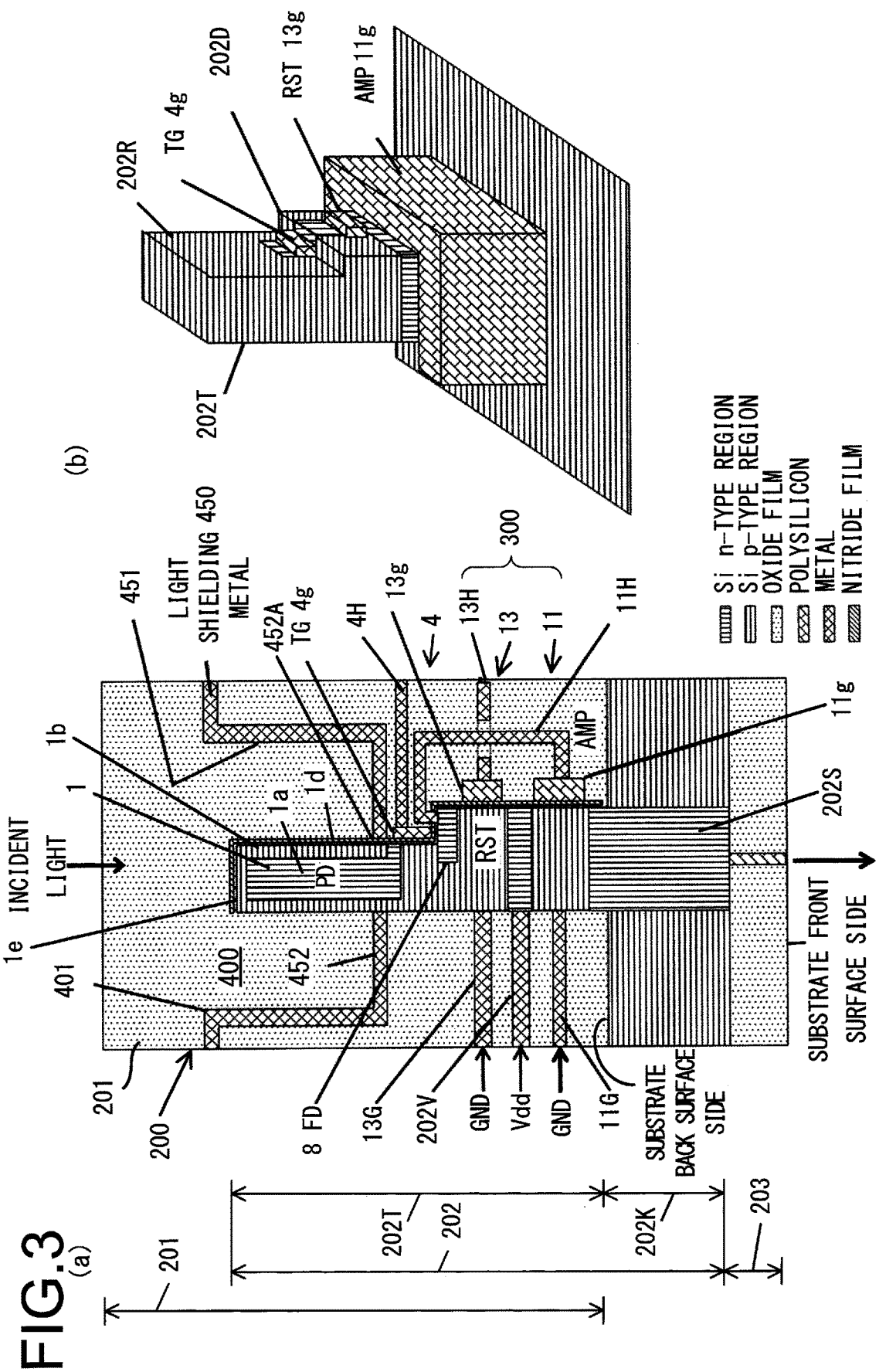
FIG. 3(a) is a cross-sectional view of the pixel 20 of the first embodiment and FIG. 3(b) is a perspective view of a protruding region.

FIG. 3(a) is a cross-sectional view illustrating a part of an element structure of the pixel 20. Incident light enters from above in FIG. 3.

The solid-state image sensor 100 is formed on a semiconductor substrate 200. The semiconductor substrate 200 is a monolithic semiconductor substrate. The semiconductor substrate 200 is configured to include a semiconductor region 202, a wiring region 201 formed on a light receiving surface side (a light incident side) of the semiconductor substrate 202 and provided with various wirings insulated from each other by an oxide layer, and an oxide film 203 formed on a side opposite to the light receiving surface of the semiconductor region 202.

As will be described later in detail, a light shielding film 450 is formed on the light receiving surface of the solid-state image sensor 100. The light shielding film 450 has a recess that forms the optical path region 400 for guiding incident light to the photoelectric conversion unit (PD) for each pixel. An entrance of the recess is formed as an opening 401 of the incident light. The light shielding film 450 is provided to prevent light incidence from onto the signal readout circuit 300 or the like.

Semiconductor Region 202

The semiconductor region 202 has a flat plate-like base region 202K and a protruding region 202T extending from the base region 202K to the light receiving surface side. In other words, at least a part of the semiconductor region 202 has the protruding region 202T extending along the light incident direction. At least a part of the semiconductor region 202 extends to the light incident side beyond an opening of the light shielding film 452 described hereinafter and thus is closer to the light receiving surface with respect to the light shielding film 452. In FIG. 3A, the semiconductor region 202 has an inverted T shape, and the protruding region 202T has a stepped prismatic shape in which a lower large-area part and an upper small-area part are connected by a stepped part 202D. The periphery of the protruding region 202T is covered with an oxide layer. At least a part of the semiconductor region 202 may extend to the light incident side beyond the light shielding film 452 or the opening 401. Further, the shape of the protruding region 202T is not limited to a prismatic shape. The shape of the protruding region 202T may be a cylinder, an elliptic cylinder, a pyramid, a cone, an elliptic cone, a sphere, an ellipsoid, a polyhedron, or other shape.

The PD 1 and the signal readout circuit 300 are formed in the protruding region 202T. The base region 202K is provided with an n-type signal path region 202S for outputting a signal outputted from the signal readout circuit 300 of the protruding region 202T to an external circuit, for example, a selection circuit (not shown) or the like. The PD 1, the signal readout circuit 300, and the signal path region 202S are formed by selectively implanting a p-type impurity and an n-type impurity into predetermined parts of a p-type region at an appropriate concentration.

In other words, the semiconductor region 202 is provided with the PD 1 converting incident light into an electric charge by photoelectric conversion and the signal readout circuit 300 for outputting the electric charges photoelectrically converted by the PD 1 as a pixel signal via the amplification transistor 11.

The signal readout circuit 300 is configured to include the transfer transistor 4 which transfers the electric charge of the PD 1 to the FD 8, the FD 8 which accumulates the transferred electric charge and converts it into a voltage, the amplification transistor 11 which amplifies the output voltage of the FD 8, and the reset transistor 13 which resets the FD 8.

The transfer transistor 4 transfers the electric charge generated in the PD 1 to the FD 8 when a gate voltage is applied to a gate electrode 4g.

The FD 8 is a capacitor that accumulates the electric charge transferred from the transfer transistor 4 and converts it into a voltage. The FD 8 is provided in a stepped part 202D below the PD 1. The electric charge generated by the photoelectric conversion is converted into a voltage by the capacitor, i.e., the FD 8, and the voltage serves as the gate voltage of the amplification transistor 11. Since a pixel signal of the pixel 20 is based on a value obtained by dividing the electric charge Q generated in the PD 1 by the capacitance C of the FD 8, a reduction in the capacitance of the FD 8 contributes to an improvement in the sensitivity of the image sensor.

The amplification transistor 11 amplifies the voltage of the FD 8 applied to the gate electrode 11g. The voltage amplified by the amplification transistor 11 is outputted to a selection circuit on the other semiconductor substrate (not shown) to be applied. The selection circuit may be arranged on the same semiconductor substrate.

It should be noted that the selection circuit formed on the semiconductor substrate not shown includes a selection transistor 12 that outputs the pixel signal, which has been outputted from the amplification transistor 11, to the vertical signal line 21.

The reset transistor 13 discharges the electric charge accumulated in the FD 8 and resets the FD 8 to the reference potential Vdd, when the gate voltage is applied to a gate electrode 13g.

Gate Electrode

A gate electrode will be described also with reference to FIG. 3(*b*). FIG. 3(*b*) is a perspective view of a protruding region 202T, illustrating gate electrodes of various transistors 4, 11, 13.

A transfer gate electrode 4g is formed by polysilicon through an oxide insulating film on a side surface 202R of the protruding region 202T opposite to a p-type region between a PD 1 and a FD 8. A transfer gate wiring 4H for supplying a gate voltage to the transfer gate electrode 4g is provided to extend in the wiring region 201 in a substrate plane direction (a direction intersecting the light incident direction). It will be noted that the oxide insulating film is covered with a nitride film.

The amplification gate electrode 11g is formed by polysilicon through the insulating film 202 on the side surface 202R of the protruding region 202T. The gate electrode 11g is a top gate electrode of the amplification transistor 11. A gate wiring 11H for supplying the gate voltage to the gate electrode 11g is provided to directly connect to the FD 8 in the wiring region 201. In other words, the gate wiring 11H is wired to pass through the oxide film and the nitride film formed on the side surface 202R of the protruding region 202T.

A back gate of the amplification transistor 11 is connected to a GND potential via the p-type region and a GND wiring 11G The GND wiring 11G is provided to extend in the substrate plane direction in the wiring region 201.

As illustrated in FIG. 3(*b*), the gate electrode 11g of the amplification transistor 11 has a U-shape in a substrate plan view and is provided around three side surfaces of the protruding region 202T which is formed in a prismatic shape. An increase in an area of the electrode can lead to a reduction in noise during amplification of the voltage of the FD 8.

The reset gate electrode 13g is formed by polysilicon on the side surface 202R of the protruding region 202T via the insulating film 202. The gate electrode 13g is a top gate electrode of the reset transistor 13. The gate wiring 13H for supplying a gate voltage to the gate electrode 13g is provided to extend in the wiring region 201 in the substrate plane direction. A back gate of the reset transistor 13 is connected to a GND potential via the p-type region and a GND wiring 13G The GND wiring 13G is provided to extend in the wiring region 201 in the substrate plane direction.

The n-type region of the semiconductor region 202 is connected to a predetermined potential (for example, a reference potential Vdd) by a Vdd wiring 202V. The Vdd wiring 202V is provided to extend in the wiring region 201 in the substrate plane direction.

As described above, the wiring region 201 is provided with the gate wiring 4H of the transfer transistor 4, the gate wiring 11H of the amplification transistor 11, the gate wiring 13H of the reset transistor 13, the GND wiring 11G 13G connecting the substrate to the GND potential, and the Vdd wiring 202V connecting the substrate to the reference potential Vdd. These wirings are made of a metal material such as aluminum, tungsten, or the like. These wirings are so-called global wirings and can be electrically connected to a substrate front surface side or a laminated substrate via through hole wirings (not shown).

Optical Path Region 400

A protruding region 202T protrudes from an oxide layer on the light receiving surface side of the semiconductor substrate 200. An optical path region 400 for guiding light enters the light receiving surface to the PD 1 is formed on the outer periphery of the PD 1 formed in the protruding region 202 T. An oxide layer is deposited inside the optical path region 400. The optical path region 400 is partitioned by a light shielding film 450 formed on the light receiving surface.

The light shielding film 450 formed on the light receiving surface of the solid state image sensor 100 has a recess that forms the optical path region 400 for guiding incident light to the photoelectric conversion unit (PD) for each pixel. An entrance of the recess is formed as an opening 401 for the incident light. The cross section of the optical path region 400 has a rectangular shape having the same size as that of the opening 401.

As described above, the PD 1 has a three-dimensional shape extending to the light incident direction. The cross-sectional shape of the PD 1 may be, for example, rectangular as is the cross-sectional shape of the optical path region 400 or the shape of the opening 401. The opening 401 in the light shielding film 450 is provided to face the PD 1 extending toward the light receiving surface side along the light incident direction. In other words, the opening 401 and the PD 1 are arranged in an overlapping manner in the substrate plan view.

The cross-sectional shape of the optical path region 400 and the shape of the opening 401 are not limited to a rectangle. For example, the cross-sectional shape of the optical path region 400 and the cross-sectional shape of the opening 401 may be a circle, an ellipse, a polygon, or an annular ring.

The inside of the optical path region 400 is not limited to the layer of oxide, as long as the transmittance of a visible light component is not less than a predetermined value. The optical path region 400 may be hollow.

A reflection film 451 is formed on an inner peripheral surface of the optical path region 400, and a light shielding film 452 is formed on the bottom (a bottom surface on the wiring region side) of the optical path region 400. The reflection film 451 and the light shielding film 452, which are made of aluminum, or the like, having high reflectance, can be formed by PVD. The reflection film 451 and the light shielding film 452 may be made of the same material or different materials, as long as the reflection film 451 is formed by a material having high reflectance and the light shielding film 452 is made of a material having low optical transmittance.

The opening 401 of the optical path region 400 is provided with a color filter and the microlens. The color filter and the microlens may be omitted, as will be described hereinafter.

Detailed Description of PD 1 and FD 8

The PD 1 will be explained in detail with reference to FIG. 3.

The PD 1 is elongated in a substrate thickness direction along the light incident direction, in the protruding region 202T which protrudes from the base region 202K toward the light receiving surface. Although the shape of the PD 1 may be a prism with matching the cross-sectional shape of the protruding region 202T, any three-dimensional shape extending along the light incident direction may be employed. The shape of the PD 1 may be a cylinder, an elliptic cylinder, a pyramid, a cone, an elliptic cone, a sphere, an ellipsoid, a polyhedron, or the like.

The substrate thickness direction is a substrate depth direction and it can thus also be referred to as a direction along the light incident direction, or a direction orthogonal to the light receiving surface. A longitudinal direction of the PD 1 can also be defined to be these directions. Alternatively, the substrate thickness direction may be defined as an optical axis direction of the microlens 462.

The PD 1 is a photoelectric conversion unit having a p-n junction which is formed by selectively implanting an n-type impurity into a predetermined region of a p-type semiconductor region 202. An n-type photoelectric conversion region 1a is formed inside the protruding region 202T, a p-type photoelectric conversion region 1b is formed around the n-type photoelectric conversion region 1a. The n-type photoelectric conversion region 1a and the p-type photoelectric conversion region 1b form a photoelectric conversion unit having a p-n junction.

Although not illustrated, the p+ region formed in the surface region of the PD 1 prevents a depletion layer of the photoelectric conversion region 1a from reaching the surface. Because the depletion layer is prevented from reaching the surface, a dark current generated at the semiconductor interface is prevented from flowing into the photoelectric conversion region 1a. In other words, the PD 1 in the first embodiment is an embedded type photodiode.

An n-type electric charge accumulation region 8 is formed at a position where it is distant from the n-type region 1a and it is across the p-type photoelectric conversion region 1b, more specifically, at a stepped part 202D of the protruding region 202T. For convenience, this n-type electric charge accumulation region will be described as the FD 8. When a gate voltage is applied to the gate electrode 4g of the transfer transistor 4, an electric current based on the electric charge accumulated in the PD 1 flows so that the electric charge is accumulated in the FD 8.

Photoelectric conversion operation by the above-described solid-state image sensor 100 will now be described.

The light receiving surface of the solid-state image sensor 100 has pixels arranged in a matrix. Light incident onto the image sensor 100 is condensed by a microlens which is provided for each pixel. The condensed light is wavelength-selected by the color filter 461 and then enters the optical path region 400 via the opening 401. A part of the incident light enters the inside of the PD 1 via the surface 1e thereof. The light incident onto the optical path region 400 except for the light incident into the PD 1 via the surface 1e, i.e., the light incident into the optical path region 400 between a side surface 1d of the PD 1 and the reflection film 451 is reflected by the reflection film 451 and enters the PD 1 via the side surface 1d. The PD 1 photoelectrically converts the light incident via the surface 1e and the side surface 1d into an electric charge. This enables the PD 1 to more efficiently generate the electric charge from the incident light.

The light incident onto the bottom of the optical path region 400 is blocked by the light shielding film 452. The light shielding films 450 and 452 prevent the incident light from entering the semiconductor region 202 where the signal readout circuit 300 is formed. This can reduce noise generation due to the light leakage into the readout circuit 300. Since the semiconductor region 202 has a protruding shape as described above, the light shielding film 452 has an opening in a region where the semiconductor region 202 extends toward the light incident side.

If the transfer transistor 4 is turned on at a time when a predetermined accumulation time has elapsed after resetting the PD 1 and the FD 8 in the transfer transistor 4 and the reset transistor 13, a detection current based on the electric charge accumulated in the PD 1 allows the electric charge to be accumulated in the FD 8. The electric charge accumulated in the FD 8 is converted into a voltage and the voltage is applied to the gate electrode 11g of the amplification transistor 11 and then amplified. The amplified pixel signal is selected as a pixel signal by a selection transistor 12 formed on a substrate not shown and outputted to the vertical signal line 21.

The detection current from the PD 1 to the FD 8 flows in a thickness direction of the semiconductor substrate. In other words, the detection current is vertically transferred. Additionally, the n-type source region and the n-type drain region of the amplification transistor 11 are arranged so that they are spaced in a longitudinal direction of the protruding region 202T, that is, they are arranged along the protruding region side surface 202R. Furthermore, the n-type source region and the n-type drain region of the reset transistor 13 are arranged so that they are spaced in a longitudinal direction of the protruding region 202T, that is, they are arranged along the protruding region side surface 202R. In the first embodiment, the reset gate electrode 13g is disposed between the transfer gate electrode 4g and the amplification gate electrode 11g in the longitudinal direction of the protruding region 202T. It should be noted that the protruding region side surface 202R is located in a direction parallel to the light incident direction.

In the solid-state image sensor 1 according to the first embodiment, therefore, the signal path from the PD 1 to the FD 8, the path of the pixel signal amplified by the amplification transistor 11, and the path of a signal of resetting the FD 8 by the reset transistor 13 are in the substrate thickness direction, that is, the light incident direction. Such an arrangement of the components of the element can result in a reduction in size of the pixel.

In a solid-state image sensor according to PTL1, a signal readout circuit 300 that picks up an electric charge as a pixel signal transfers the signal between a transfer circuit, an amplification circuit, and a selection circuit along a surface of a semiconductor substrate. This causes an increase in size of the pixel and provides a limitation for high-density mounting.

Advantageous effects of the solid-state image sensor according to the first embodiment described above are as follows.

(1) The solid-state image sensor 100 includes a photoelectric conversion unit (PD) 1 that photoelectrically converts incident light to generate an electric charge, a charge voltage conversion unit (FD: the accumulation unit) 8 that converts the electric charge generated by the PD 1 into a voltage, and the amplification transistor (the readout unit) 11 that amplifies the voltage resulting from the conversion by the FD 8 are arranged along the depth direction, i.e., the thickness direction, of the semiconductor substrate 200. In the solid-state image sensor 100 according to the first embodiment, the thickness direction of the semiconductor substrate is the light incident direction. The semiconductor substrate thickness direction is also the optical axis direction of the microlens 462.

Such a configuration can achieve a reduction in size of the pixel.

(2) In the solid-state image sensor 100 according to the first embodiment, at least the PD 1, the FD 8, and the amplification transistor 11 are arranged along the depth direction from the light receiving surface of the semiconductor substrate 200. In particular, the FD 8 is arranged between the PD 1 and the amplification transistor 11 along the substrate depth direction. The depth direction from the light receiving surface of the semiconductor substrate 200 is also the optical axis direction of the microlens 462.

A charge signal of the PD 1 flows in the semiconductor substrate thickness direction and is transferred to the FD 8 where the charge signal is accumulated and then converted into a voltage. The voltage is amplified by the amplification transistor 11. The amplified signal flows in the semiconductor substrate thickness direction.

This configuration can, therefore, reduce the size of the pixel compared with a solid-state image sensor in which the charge signal of the PD is transferred in the substrate plane direction or the amplified voltage signal of the FD flows in the substrate plane direction.

(3) The solid-state image sensor 100 according to the first embodiment is provided on the semiconductor substrate 200. The semiconductor substrate 200 has a first surface and a second surface that intersect the light incident direction. The semiconductor substrate 200 includes the PD 1 that photoelectrically converts incident light to generate an electric charge, the FD 8 that converts the electric charge generated by the PD 1 into a voltage, and the amplification transistor 11 that amplifies the voltage resulting from the conversion by the FD 8, which are arranged between the first surface and the second surface. The PD 1 is arranged on the first surface side with respect to the light incident direction, the amplification transistor 11 is arranged on the second surface side with respect to the PD 1, and the FD 8 is arranged between the PD 1 and the amplification transistor 11.

A charge signal of the PD 1 flows in the semiconductor substrate thickness direction and is transferred to the FD 8 where the charge signal is accumulated and then converted into a voltage. This voltage is amplified by the amplification transistor 11. The amplified signal flows in the thickness direction of the semiconductor substrate.

This configuration can, therefore, reduce the size of the pixel when compared with a solid-state image sensor in which the charge signal of the PD is transferred in the substrate plane direction or the amplified voltage signal of the FD flows in the substrate plane direction.

(4) In the solid-state image sensor 100 according to the first embodiment, the FD 8 is arranged on the second surface side with respect to the PD 1 in the light incident direction, and the amplification transistor 11 is arranged on the second surface side with respect to the FD 8 in the light incident direction.

(5) In the solid-state image sensor 100 according to the first embodiment, the first surface is a surface onto which incident light enters.

(6) The solid-state image sensor 100 according to the first embodiment is provided on the semiconductor substrate 200. The semiconductor substrate 200 is provided with the PD 1 that photoelectrically converts incident light to generate an electric charge, the FD 8 that converts the electric charge generated by the PD 1 into a voltage, and the amplification transistor 11 that amplifies the voltage resulting from the conversion by the FD 8. At least the PD 1 is provided in the optical path region 400 formed by the light shielding unit 450 that at least partly shields the semiconductor substrate.

Such a configuration can achieve a reduction in size of the pixel even in a solid-state image sensor in which incident light is received via a plurality of surfaces of the PD 1 to enhance photoelectric conversion efficiency.

(7) The semiconductor substrate 202 of the solid-state image sensor 100 according to the first embodiment has the base region 202K having a plane extending in the same direction as that of the light receiving surface and a protruding region 202T having a shape protruding from the base region 202K on the light receiving surface side. The PD 1, the FD 8, the amplification transistor 11, and the reset transistor 13 are provided in the protruding region 202T. The transfer gate electrode 4g, the reset gate electrode 13g, and the amplification gate electrode 11g are arranged at predetermined separations in the substrate thickness direction along the side surface 202R of the protruding region 202T. A direction of the electric charge transfer from PD 1 to FD 8, and a direction of an electric current in the p-type region directly under the gate electrode between a source and drain in the reset transistor 13 and between a source and drain in the amplification transistor 11 are the substrate thickness direction along the side surface 202R of the protruding region 202T. This configuration can, therefore, reduce the size of the pixel compared with a solid-state image sensor that allows one or all of these signals to flow in the substrate surface direction.

The opening 401, the PD 1, and the transfer transistor 4, the amplification transistor 11, and the reset transistor 13, which constitute the readout circuit 300, are arranged to overlap each other in the substrate plan view. In the first embodiment, these transistors 4, 11, 13 are included in the plan view region of the opening 401. This contributes to a reduction in size of the pixel, in combination with the shape of the protruding PD 1.

(8) The solid-state image sensor 100 according to the first embodiment includes the semiconductor region 202 having the protruding region 202T provided with the PD (the photoelectric conversion region) 1 that photoelectrically converts incident light to generate the electric charge and the readout circuit 300 including the FD (the electric charge transfer region) 8 to which the electric charge is transferred from the PD 1. The protruding region 202T protrudes into the optical path region 400 provided on the light receiving surface side.

This configuration can enhance the quantum effect and prevent deterioration in the S/N ratio associated with a reduction in size of the pixel, since incident light enters via both the surface 1e and the surface 1d. Accordingly, a high quality image having a low noise can be obtained even with a solid-state image sensor that is read at a high speed such as 1000 to 10000 frames/sec.

(9) The PD 1 is formed so as to pass through the bottom of the optical path region 400 and to extend to the light receiving surface side. The light shielding film 452 is formed at the bottom of the optical path region 400 to prevent a part of the light entering the optical path region 400 around the PD 1 from traveling downward in the optical path region 400 and entering the readout circuit 300 as leaked light.

Noise generation due to the light leakage to the readout circuit 300 can thus be reduced even in a configuration that enables light to enter via the periphery of the PD 1.

A selection transistor (SEL) 14 that selects a signal read out by the amplification transistor (AMP) 11 may be arranged in the protruding region 202T. In this case, the FD 8, the AMP 11, and the SEL 14 are preferably provided along the optical axis direction of the microlens. Also in this case, the AMP 11 is provided between the FD 8 and the SEL 14 along the optical axis direction of the microlens.

The signal read out by the AMP 11 flows in the direction along the optical axis of the microlens, which is the substrate thickness direction, and is inputted to the SEL 14. Further, the signal selected by the SEL 14 preferably flows in the direction along the optical axis of the microlens, which is the substrate thickness direction.

The solid-state image sensor 100 according to the first embodiment can also be described as follows.

(1) The solid-state image sensor 100 according to the first embodiment includes: the accumulation unit (FD) 8 that accumulates the electric charge generated by the photoelectric conversion unit (PD) 1 photoelectrically converting incident light transmitted through the microlens 462 and being incident thereon; and a readout unit (AMP) 11 that read out a signal based on the voltage of the accumulation unit (FD) 8, wherein the accumulation unit (FD) 8 and the readout unit (AMP) 10 are arranged along the optical axis direction of the microlens 462.

(2) The solid-state image sensor 100 according to the first embodiment includes output units (gate electrodes, gate wirings) 11G 11H that output a signal based on the voltage of the accumulation unit (FD) 8 to the readout unit (AMP) 11, wherein the output units (gate electrodes, gate wirings) 11G 11H are provided between the accumulation unit (FD) 8 and the readout unit (AMP) 11 in the optical axis direction of the microlens 462.

(3) The solid-state image sensor 100 according to the first embodiment has the first surface (the semiconductor back surface which is the light incident surface, or the substrate front surface) and the second surface (the semiconductor back surface which is the light incident surface, or the substrate front surface which is opposite to the semiconductor back surface) which intersect the optical axis of the microlens, and includes, between the first surface and the second surface, the accumulation unit (FD) 8 that accumulates an electric charge generated by the photoelectric conversion unit (PD) 1 that photoelectrically converts incident light transmitted through the microlens 462, the readout unit (AMP) 11 that read out a signal based on the voltage of the accumulation unit (FD) 8, and output units (gate electrodes, gate wirings) 11G 11H that output the signal based on the voltage of the accumulation unit (FD) 8 to the readout unit (AMP) 11. In the image sensor 100, the accumulation unit (FD) 8 is provided on the first surface side, the readout unit (AMP) 11 is provided on the second surface side, and the output units (gate electrodes, gate wirings) 11G 11H are provided between the accumulation unit (FD) 8 and the readout unit (AMP) 11, with respect to the optical axis direction of the microlens 462.

(4) The first surface of the solid-state image sensor 100 as described in (3) above is the light incident surface onto which light enters.

(5) The output units of the solid-state image sensor 100 as described in (2) to (4) above are the gate electrode 11G and the gate wiring 11H that output the signal based on the accumulation unit (FD) 8 to the readout unit (AMP) 11.

(6) The photoelectric conversion unit (PD) 1, the accumulation unit (FD) 8, and the readout unit (AMP) 11 of the solid-state image sensor 100 as described in (1) to (4) above are arranged along the optical axis direction of the microlens 462.

(7) The accumulation unit (FD) 8 of the solid-state image sensor 100 as described in (1) to (4) above is arranged between the photoelectric conversion unit (PD) 1 and the readout unit (AMP) 11 in the optical axis direction of the microlens.

(8) The solid-state image sensor 100 as described in (1) to (4) above further includes a light shielding film (light shielding unit) 452 that blocks light transmitted through the microlens 462 and enters the accumulation unit (FD) 8. The photoelectric conversion unit (PD) 1 receives incident light transmitted through the microlens 462 between the microlens 462 and the light shielding film (the light shielding unit) 452.

(9) The photoelectric conversion unit (PD) 1 of the solid-state image sensor 100 as described in (3) above has the light receiving surface 1d that receives light enters from a direction that intersects an optical axis of the microlens 462, between the microlens 462 and the light shielding film (the light shielding unit) 452.

(10) The photoelectric conversion unit (PD) 1 of the solid-state image sensor 100 as described in (8) to (9) above has a plurality of light receiving surfaces 1e, 1d that receives incident light transmitted through the microlens 462, between the microlens 462 and the light shielding unit 452.

(11) At least a part of the photoelectric conversion unit (PD) 1 of the solid-state image sensor 100 as described in (8) to (10) above protrudes to the light incident side with respect to the light shielding unit 452.

(12) The light shielding unit 452 of the solid-state image sensor 100 as described in (11) above has the opening 452A, and at least a part of the photoelectric conversion unit (PD) 1 protrudes beyond the light shielding unit 452 through the opening 452A to the light incident side.

(13) The solid-state image sensor as described in (1) above further includes a selection unit (SEL) 14 for selecting a signal read by the readout unit (AMP) 11, wherein the accumulation unit (FD) 8, the readout unit (AMP) 11, and the selection section (SEL) 14 are arranged along the optical axis direction of the microlens.

(14) The readout unit (AMP) 11 of the solid-state image sensor as described in (13) above is arranged between the accumulation unit (FD) 8 and the selection unit (SEL) 14 along the optical axis direction of the microlens.

Manufacturing Process

A method of manufacturing the solid-state image sensor 100 described above will now be described. Description of mask shapes uses in several steps and processes such as resist coating will be omitted hereinafter.

1st to 4th Steps

Figure 4:
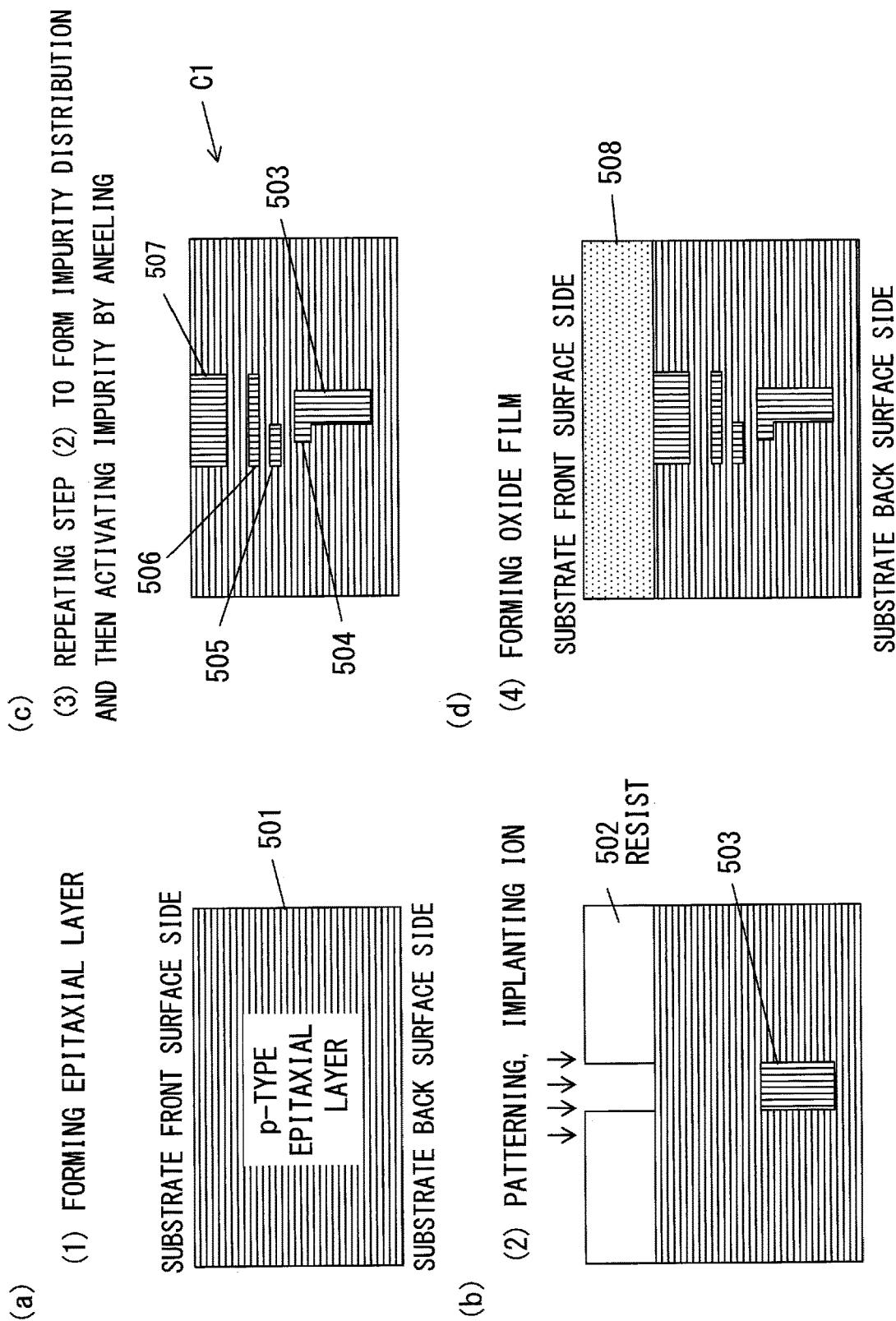
FIG. 4 is a view illustrating steps in the first embodiment.

FIG. 4(a): In order to manufacture the solid-state image sensor 100, a p-type epitaxial layer 501 is formed on an n-type semiconductor substrate.

FIG. 4(b): A resist 502 is coated on an upper surface of the p-type epitaxial layer 501 and the resist 502 is patterned, and then the p-type epitaxial layer 501 is doped with an n-type impurity to form an n-type region 503 at the deepest position.

FIG. 4(c): The step of FIG. 4(b) is repeated several times to form n-type regions 504 to 507. Thereafter, annealing is performed to activate the doped impurity.

It should be noted that the n-type regions 503 and 504 are regions to be the PD 1, the n-type region 505 is a region to be the FD 8, and the n-type regions 506 and 507 are regions to be the source region and the drain region of the reset transistor 13 and the amplification transistor 11.

FIG. 4(d): An oxide film 508 is formed on an upper surface of an intermediate product C1 on which the n-type regions 503 to 507 are formed in FIG. 4(c).

5th to 8th Steps

Figure 5:
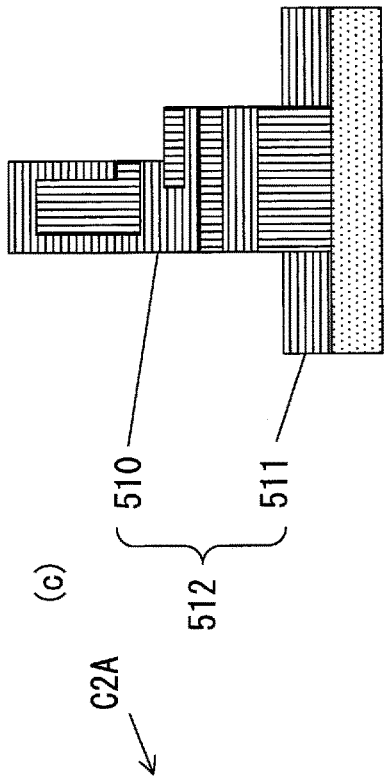
FIG. 5 is a view illustrating steps in the first embodiment, subsequent to the steps in FIG. 4.
Figure 5:
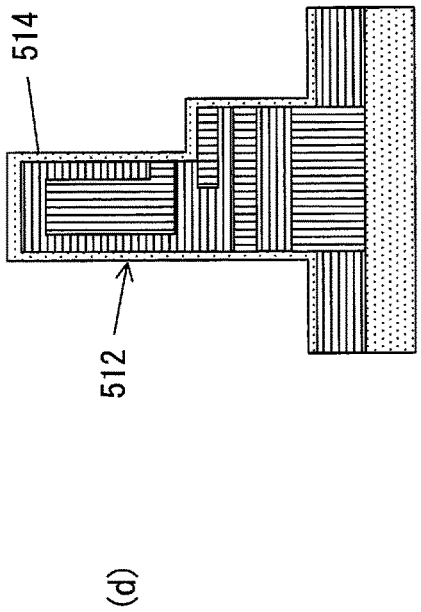
Figure 5:
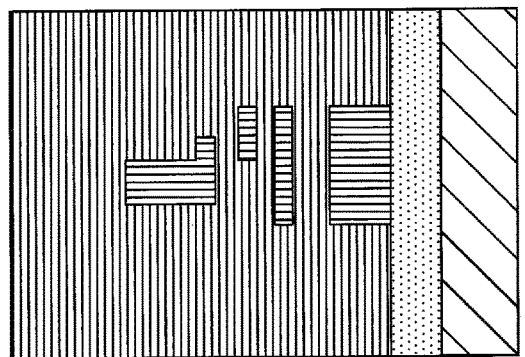
Figure 5:
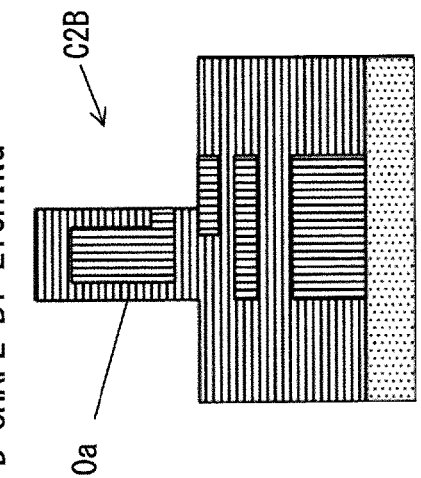

FIG. 5(a): A support substrate 509 is attached to an upper surface of the oxide film 508, and then the substrate is inverted upside down to polish a back surface thereof.

Illustration of the support substrate 509 will be omitted in figures illustrating the following steps.

FIG. 5(b): An intermediate product C2A obtained in FIG. 5(a) is etched from the back surface side of the substrate to form a protruding part 510a.

FIG. 5(c): An intermediate product C2B formed in the step of FIG. 5(b) is further etched to form a semiconductor part 512 composed of a protruding part 510 and a flat plate part 511. The semiconductor part 512 becomes the semiconductor region 202.

FIG. 5(d): An oxide film 514 is formed on a surface of the semiconductor part 512. The oxide film 514 becomes a gate oxide film.

9th to 12th Steps

Figure 6:
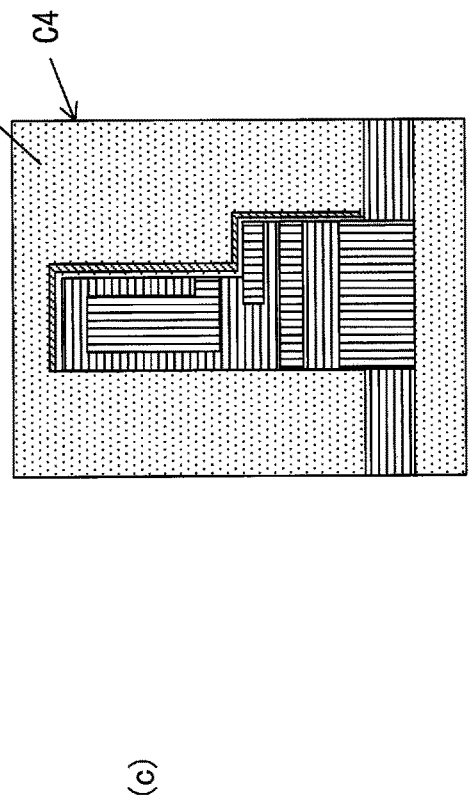
FIG. 6 is a view illustrating steps in the first embodiment, subsequent to the steps in FIG. 5.
Figure 6:
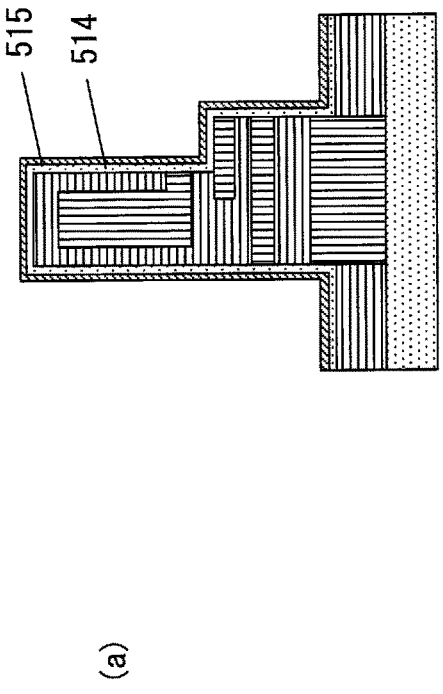
Figure 6:
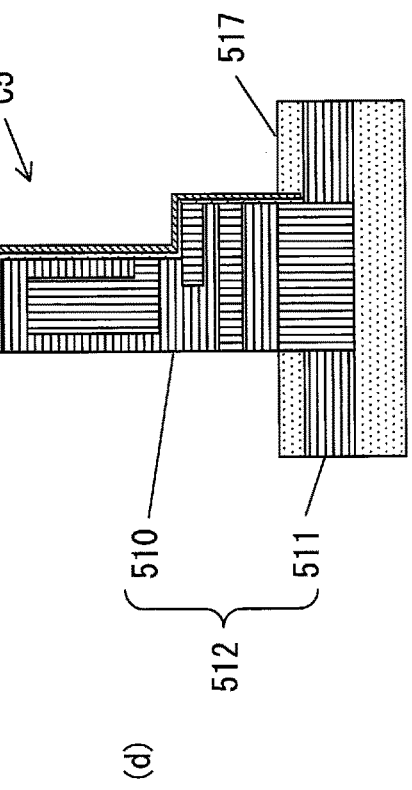
Figure 6:
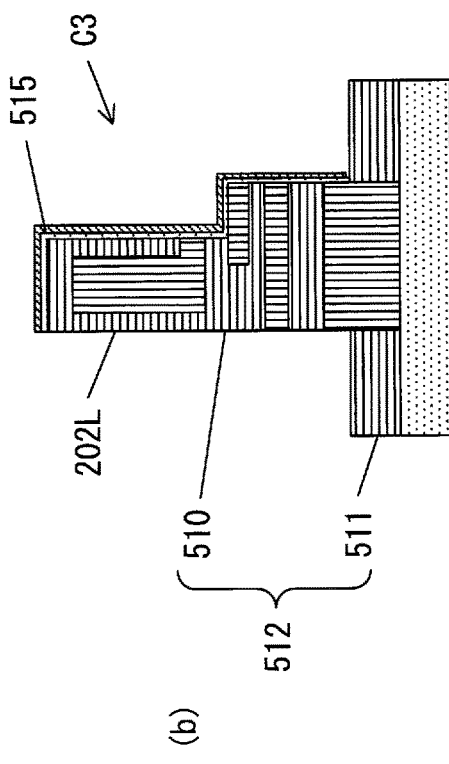

FIG. 6(a): A nitride film 515 is formed on a surface of the gate oxide film 514 formed in the step of FIG. 5(d).

FIG. 6(b): A surface of the nitride film 515 formed in the step of FIG. 6(a) is patterned and then etched to produce an intermediate product C3. In the intermediate product C3, the oxide film 514 and the nitride film 515 on a surface of the flat plate part 511 are removed. Additionally, the oxide film 514 and the nitride film 515 on the left side surface 202L of the protruding part 510 are removed.

FIG. 6(c): An intermediate product C4 in which an oxide film 516 is formed on a surface of the intermediate product C3 produced in FIG. 6(b) is produced.

FIG. 6(d): The oxide film 516 on a surface of the intermediate product C4 produced in FIG. 6(c) is etched to produce an intermediate product C5 in which an oxide film 517 having a predetermined thickness is formed on an upper surface of the flat plate part 511.

13th to 16th Steps

Figure 7:
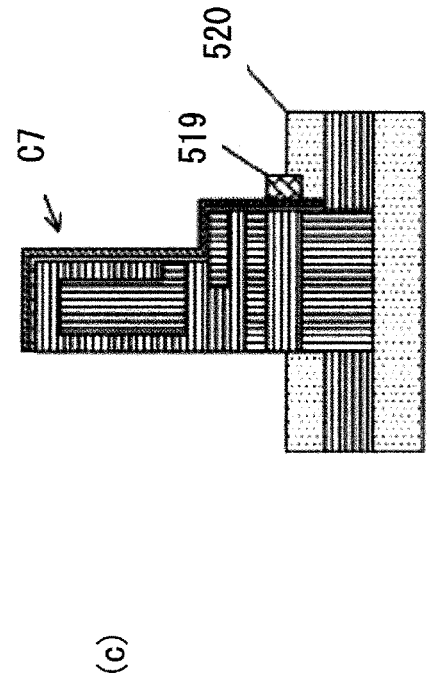
FIG. 7 is a view illustrating steps in the first embodiment, subsequent to the steps in FIG. 6.
Figure 7:
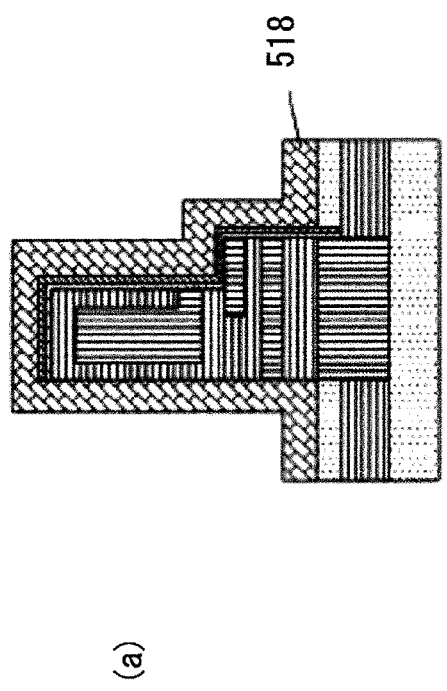
Figure 7:
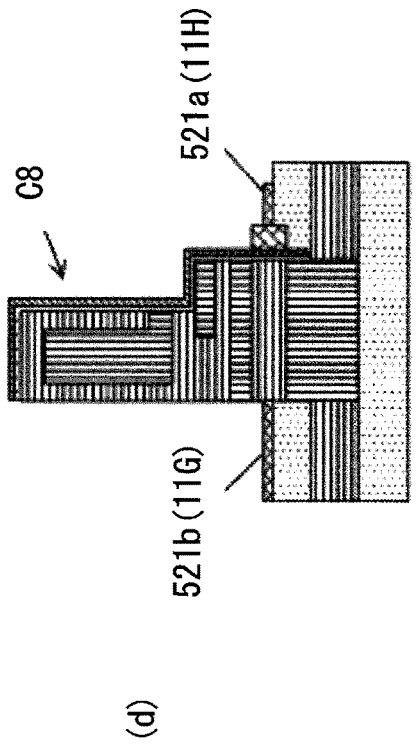
Figure 7:
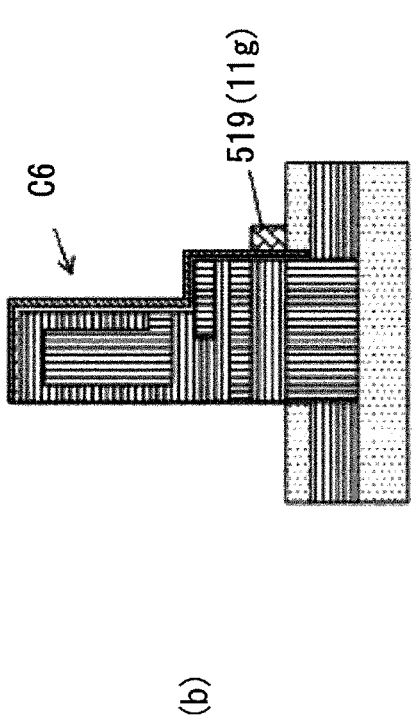

FIG. 7(a): Polysilicon 518 is formed on an upper surface of an intermediate product C5 produced in FIG. 6(d).

FIG. 7(b): A surface of the polysilicon 518 formed in the step of FIG. 7(a) is patterned and then etched to form a gate part 519, which serves as the gate electrode 11g of the amplification transistor 11. The resulting product is an intermediate product C6.

FIG. 7(c): The intermediate product C6 created in FIG. 7(b) is subjected to an oxide film forming process and an etching process in the same manner as in FIGS. 6(c) and (d), so that a side surface on the bottom side of the gate part 519 of the intermediate product C6 is covered with an oxide film 520.

FIG. 7(d): An intermediate product C7 obtained in FIG. 7(c) is subjected to a process of vapor depositing aluminum, tungsten, or the like and a processes of patterning and etching to form wiring parts 521a, 521b on an upper surface of the oxide film 520 of the intermediate product C7. The wiring parts 521a and 521b serve as the gate 11H and the GND wiring 11G of the amplification transistor 11.

17th to 20th Steps

Figure 8:
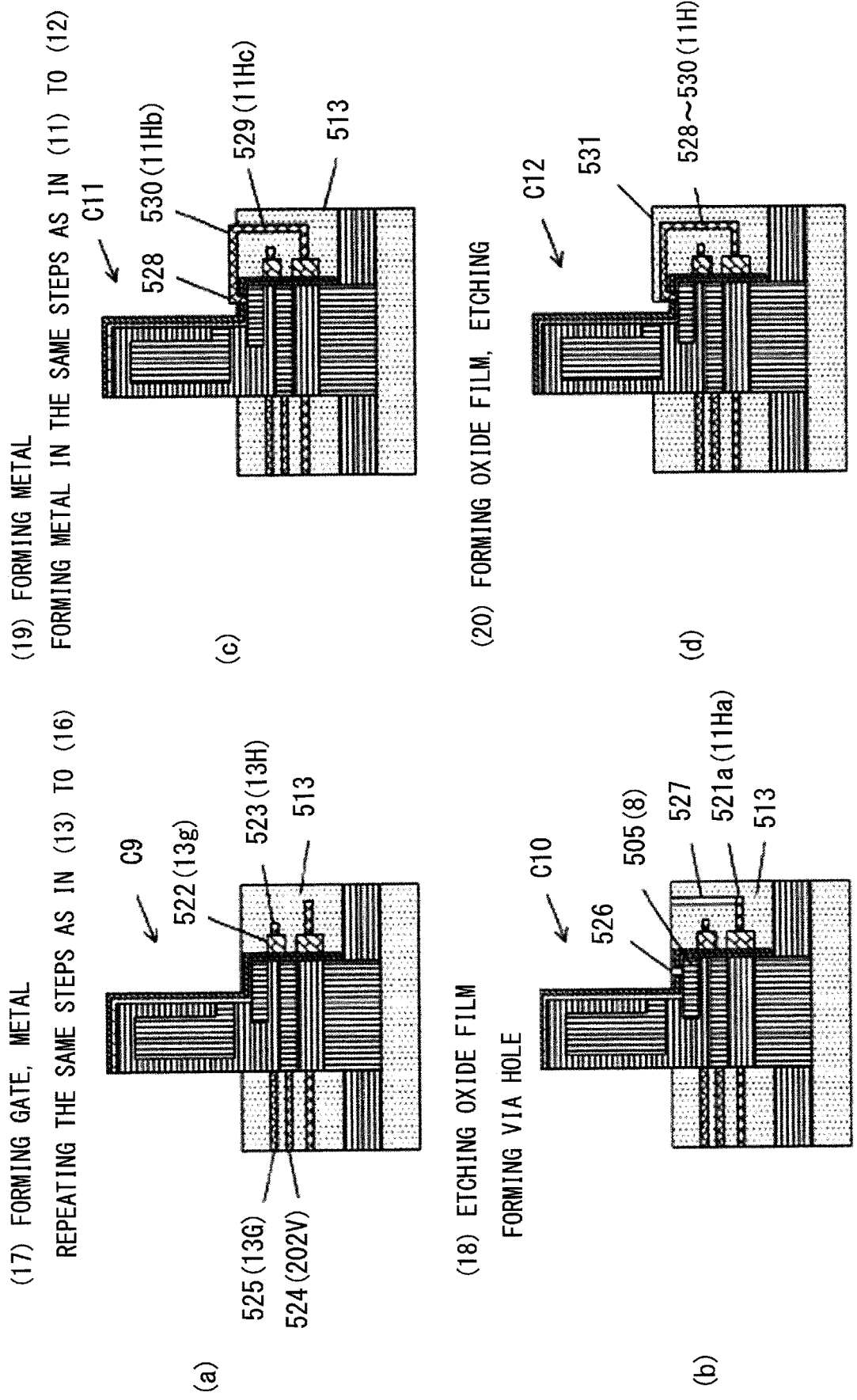
FIG. 8 is a view illustrating steps in the first embodiment, subsequent to the steps in FIG. 7.

FIG. 8(a): In the same manner as in FIGS. 7(a) to 7(d), an intermediate product C8 after having the step of FIG. 7(d) is subjected to a polysilicon forming process, a patterning and etching processes, an oxide film thickening process, and a wiring forming process in a repeated manner to produce an intermediate product C9 in which the following elements are formed in the oxide film 520 of the intermediate product C8.

These elements include a gate part 522 which serves as the gate electrode 13g of the reset transistor 13, a wiring part 523 which serves as the gate wiring 13H of the reset transistor 13, a wiring part 524 which serves as the Vdd wiring 202V connected to the back gate of the reset transistor 13, and a wiring part 525 which serves as the GND wiring 13G of the reset transistor 13.

FIG. 8(b): An intermediate product C9 obtained in the step of FIG. 8(a) is processed to have a via hole 526 extending from the surface of the oxide film 513 to the n-type region 505 which serves as the FD 8 and a via hole 527 extending to a wiring part 521a which is a part of the amplification gate wiring 11H.

FIG. 8(c): Wiring metals 528 and 529 are formed in the via holes 526 and 527 of an intermediate product C10 obtained in the step of FIG. 8(b), and a wiring metal 530 connecting these wiring metals 528 and 529 is formed on an upper surface of the oxide film 520.

FIG. 8(d): An intermediate product C11 obtained in FIG. 8(c) is subjected to an oxide film forming process and a patterning and etching processes to coat the wiring metals 528 to 530, which serves as the amplification gate wiring 11H, with an oxide film 531.

21th to 24th Steps

Figure 9:
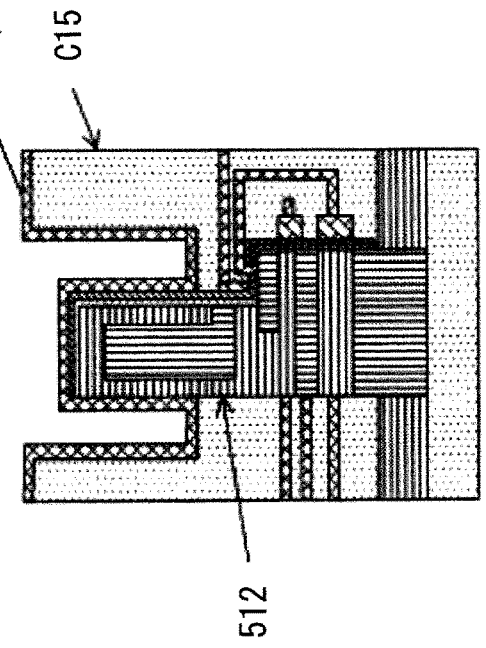
FIG. 9 is a view illustrating steps in the first embodiment, subsequent to the steps in FIG. 8.
Figure 9:
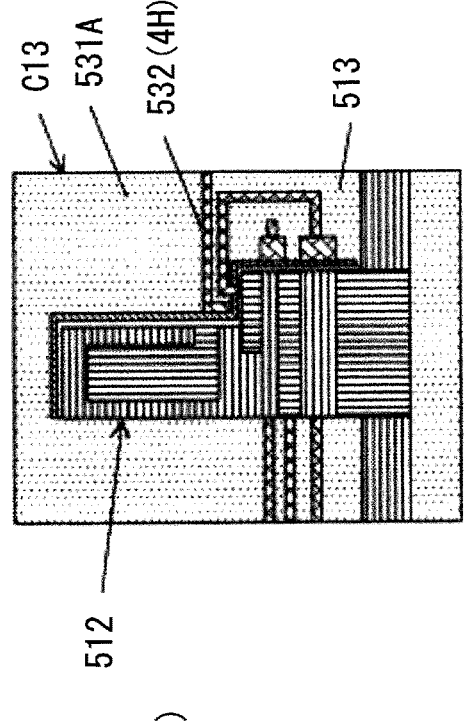
Figure 9:
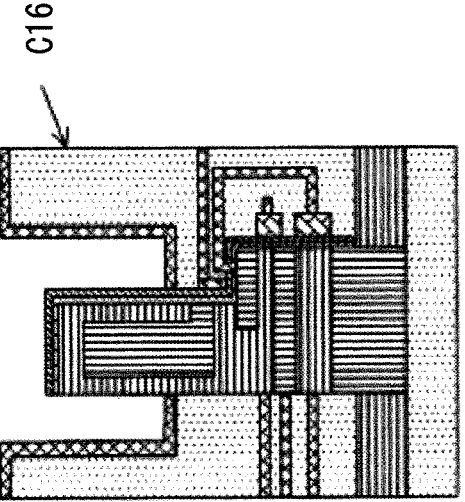
Figure 9:
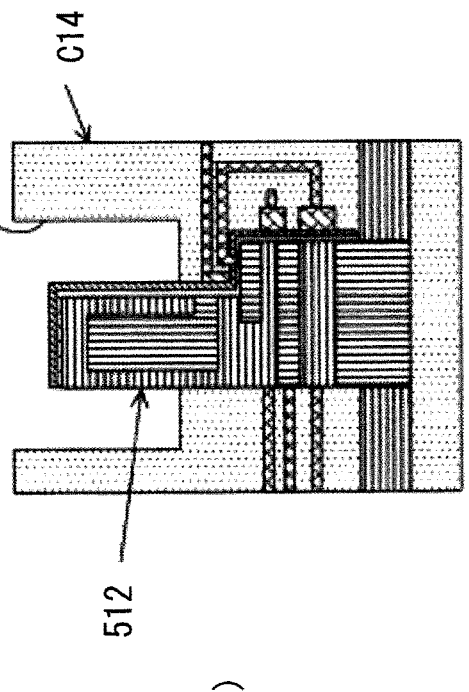

FIG. 9(a): In the similar manner to FIGS. 7(a) to 7(d), an intermediate product C12 obtained in the step of FIG. 8(d) is subjected to a polysilicon forming process, a patterning and etching processes, an oxide film thickening process, and a wiring forming process to form a wiring metal 532, which serves as the gate wiring 4H, in the oxide film 531 of the intermediate product C12. Then, an oxide film is further deposited on the oxide film 531. Reference sign 531A denotes a thick oxide film.

FIG. 9(b): In an intermediate product C13 obtained in the step of FIG. 9(a), an oxide film 531A around the semiconductor part 512 which serves as the protruding region 202T is etched to form a recess 533 which serves as the optical path region 400.

FIG. 9(c): A metal film 534 which serves as a light shielding film 450, a reflection film 451, and a light shielding film 452 is formed on an upper surface of an intermediate product C14 obtained in the step of FIG. 9(b).

FIG. 9(d): In an intermediate product C15 obtained in FIG. 9(c), the metal film 534 deposited around the semiconductor part 512 which serves as the protruding region 202T is removed by etching process.

25th to 26th Steps

Figure 10:
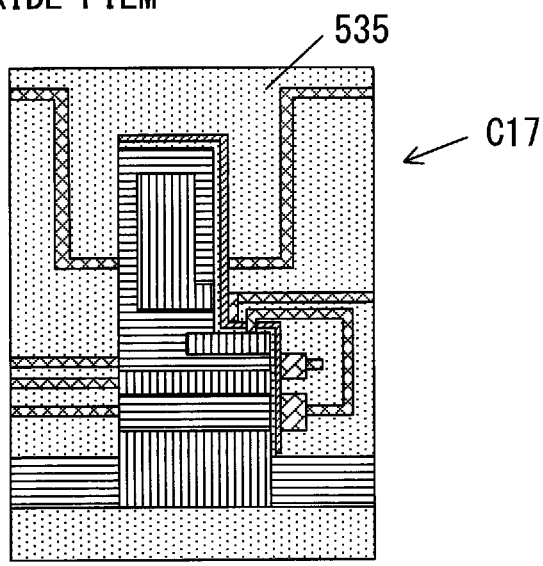
FIG. 10 is a view illustrating steps in the first embodiment, subsequent to the steps in FIG. 9.
Figure 10:
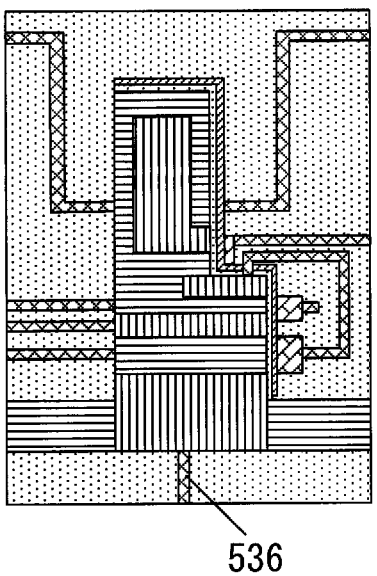

FIG. 10(a): An oxide film 535 is formed on an upper surface of an intermediate product C16 obtained in the step of FIG. 9(d).

FIG. 10(b): A process of forming a via hole is performed from a surface of an intermediate product C17 obtained in the step of FIG. 10(a) toward an n-type region of the semiconductor substrate base region 202K, and a process of forming a wiring metal in the via hole is performed to form a wiring metal 536. This is the solid-state image sensor 100 described with reference to FIG. 3. The manufacturing method described above is meant only as an example, and various steps for manufacturing the solid-state image sensor 100 of FIG. 3 may be adopted.

Second Embodiment

Figure 11:
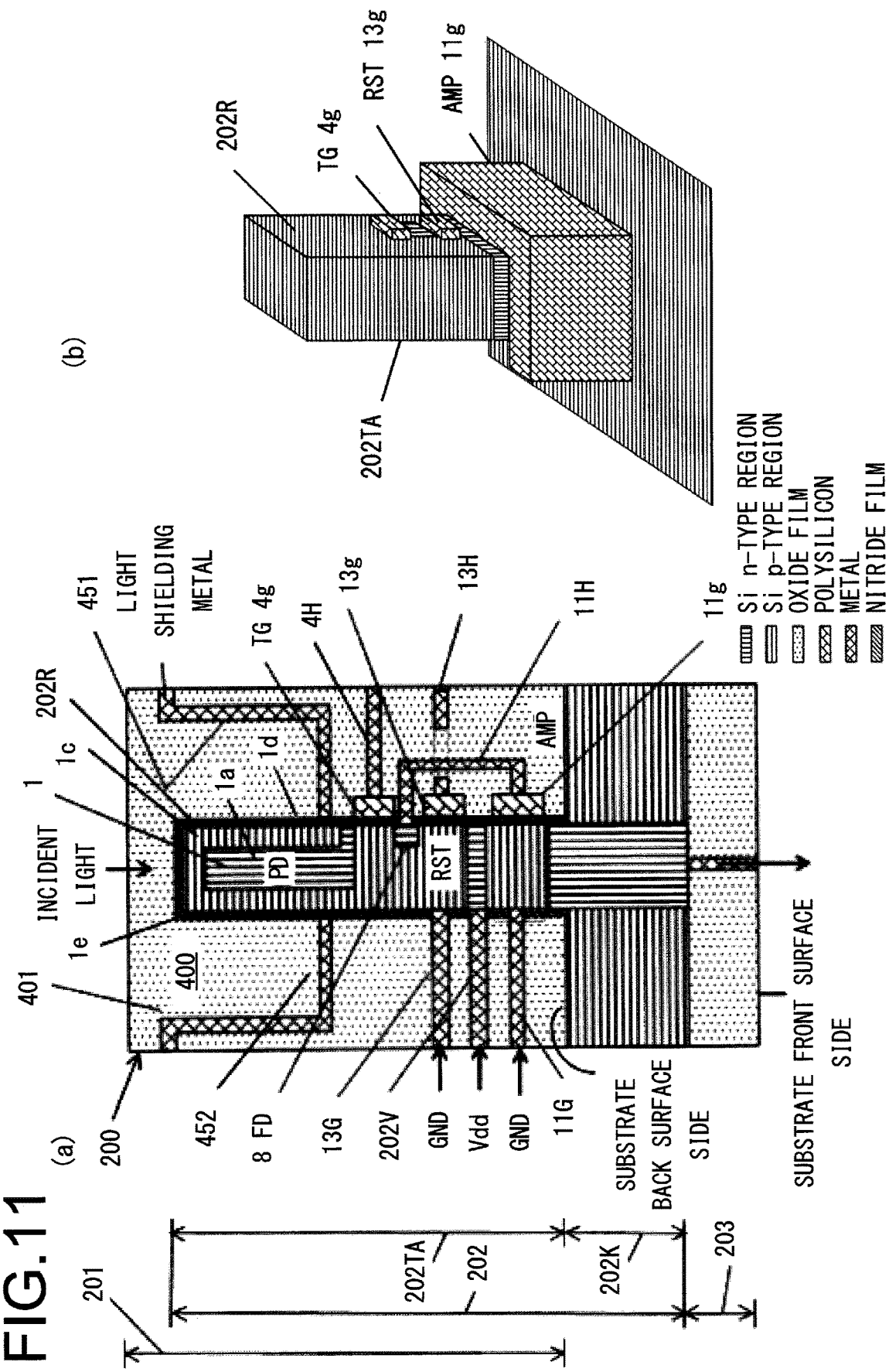
FIG. 11(a) is a cross-sectional view of a pixel 20 of a second embodiment and FIG. 11(b) is a perspective view of a protruding region.

FIG. 11 is a view illustrating a solid-state image sensor 100A according to a second embodiment. The same parts as those of the solid-state image sensor 100 according to the first embodiment are denoted by the same reference signs, and a detailed description thereof is omitted.

A semiconductor substrate 202 of the solid-state image sensor 100A has a light receiving surface on a substrate back surface side. The semiconductor substrate 202 includes a flat plate-like base region 202K having a plane extending in the same direction of that of the light receiving surface and a protruding region 202TA having a protruding shape from the base region 202K toward the light receiving surface side.

The protruding region 202TA has a prismatic shape having a rectangular cross section, and the PD 1 is provided at the uppermost part on the substrate back surface side. The configuration of the PD 1 is the same as that in the first embodiment, and a description thereof will be omitted.

Unlike the first embodiment, a right side surface 202R of the protruding region 202TA is one flat surface without a step as illustrated in FIG. 11(*a*). The PD 1, the FD 8, the transfer transistor 4, the amplification transistor 11, and the reset transistor 13 are spaced apart from each other in the substrate thickness direction along the side surface 202R. The gate electrodes 4*g*, 11*g*, and 13*g* are spaced with respect to the substrate thickness direction on an oxide film surface of the side surface 202R.

The substrate thickness direction is a substrate depth direction and can thus also be referred to as a longitudinal direction of the PD 1, a direction along the light incident direction, or a direction orthogonal to the light receiving surface. The substrate thickness direction is also the optical axis direction of the microlens 462.

The FD 8 is distant from an n-type region 1*a* of the PD 1 and it is across the p-type region along the light incident direction. A transfer gate electrode 4*g* is provided on a surface of the p-type region between the PD 1 and the FD 8, i.e., on the right side surface 202R of the protruding region 202TA interposing a gate oxide film (see reference sign 302 in FIG. 12(*a*)). When a transfer gate voltage is supplied to the transfer gate electrode 4*g*, the electric charge accumulated in the PD 1 is transferred to the FD 8.

The voltage resulting from the conversion by the FD 8 is applied to the gate electrode 11*g* of the amplification transistor 11 via an amplification gate wiring 11H. An n-type drain region and an n-type source region of the amplification transistor 11 are provided at a predetermined separation in the light incident direction with across the p-type back gate region therebetween. The amplification gate electrode 11*g* is arranged in the p-type back gate region between the n-type drain region and the n-type source region via an oxide film.

The reset transistor 13 has an n-type source region provided at a predetermined distance from the FD 8 in the light incident direction. The reset gate electrode 13*g* is arranged at a position facing the p-type back gate region between the n-type drain region and the n-type source region via an oxide film.

The solid-state image sensor 100A according to the second embodiment can achieve the following advantageous effect.

The solid-state image sensor according to the second embodiment can achieve the following advantageous effects, in addition to the same advantageous effects as those of the first embodiment.

(1) At least the PD 1, the FD 8, and the amplification transistor 11 are arranged at predetermined distances in the substrate thickness direction along the side surface 202R in the protruding region 202TA. A direction of the electric charge transfer from PD 1 to FD 8, and a direction of an electric current in the p-type region directly under the gate electrode between a source and drain in the amplification transistor 11 are the substrate thickness direction. The gate electrode 13*g* of the reset transistor 13 is also provided on the one side surface 202R of the protruding region 202TA and the direction of the electric current between a source and drain of the reset transistor 13 is also the substrate thickness direction along the side surface 202R.

The solid-state image sensor 100A according to the second embodiment can thus reduce the size of the pixel, compared with a solid-state image sensor configured to flow one or all of the above signals in the substrate in-plane direction.

(2) The step required for the protruding region 202T of the first embodiment is eliminated, and the protruding region 202TA having a side surface 202R defining a plane is provided.

As can be seen by comparing FIG. 11 with FIG. 3, the size of the FD 8 can thus be reduced so that a conversion gain can be increased. Additionally, the cross-sectional area of the protruding region 202TA can be reduced. This can lead to a further reduction in size compared with the solid-state image sensor of the first embodiment illustrated in FIG. 3.

Manufacturing Process

The solid-state image sensor 100A described above has various gate electrodes arranged with respect to the light incident direction on one side surface 202R of the protruding region 202TA. The amplification gate wiring 11H connecting the FD 8 to the gate electrode 11*g* of the amplification transistor 11 is required to pass through the oxide film and the nitride film, which cover the protruding region side surface 202R, to connect to the FD 8 of the n-type region. A method of manufacturing a part connecting the amplification gate wiring 11H with the FD 8 will be described with reference to FIGS. 12 to 15. Description of mask shapes uses in several steps and processes such as resist coating will be omitted hereinafter.

Figure 12:
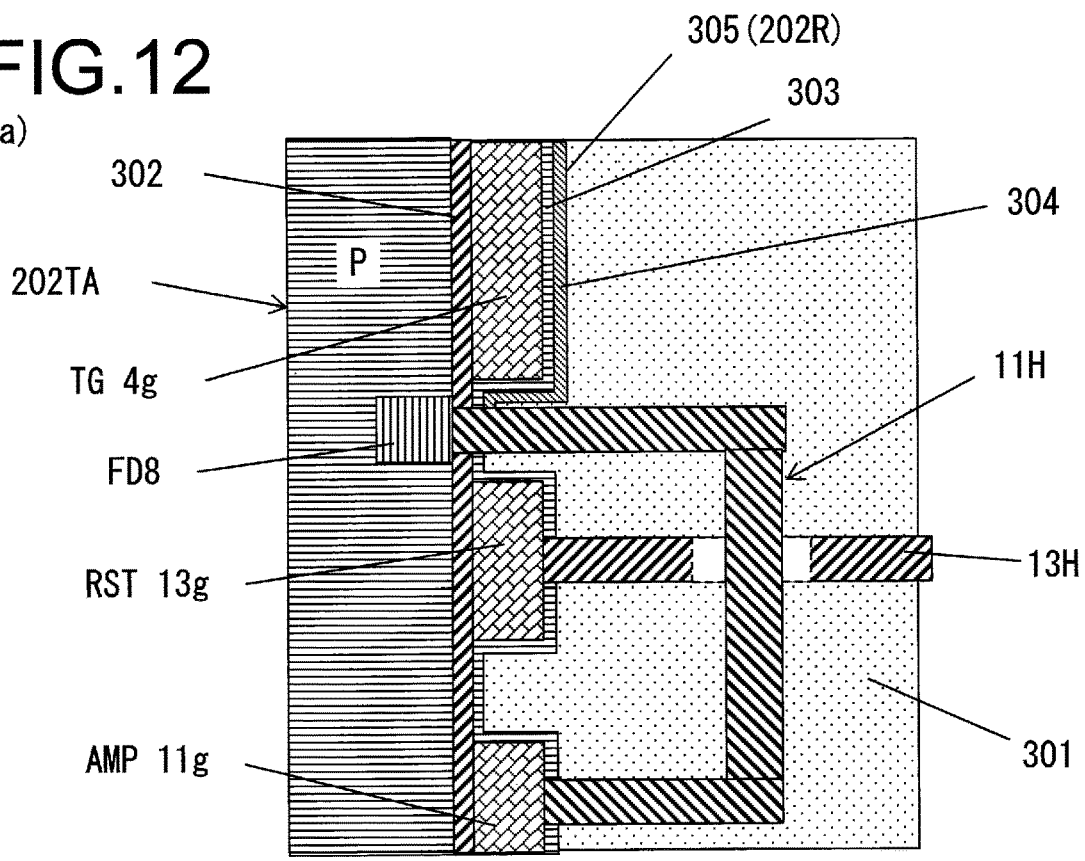
FIG. 12(a) is a longitudinal cross-sectional view for explaining a connecting part between a FD and a gate wiring 11H in a second embodiment and FIG. 12(b) is a longitudinal cross-sectional view for explaining the gate wiring 11H in detail.
Figure 12:
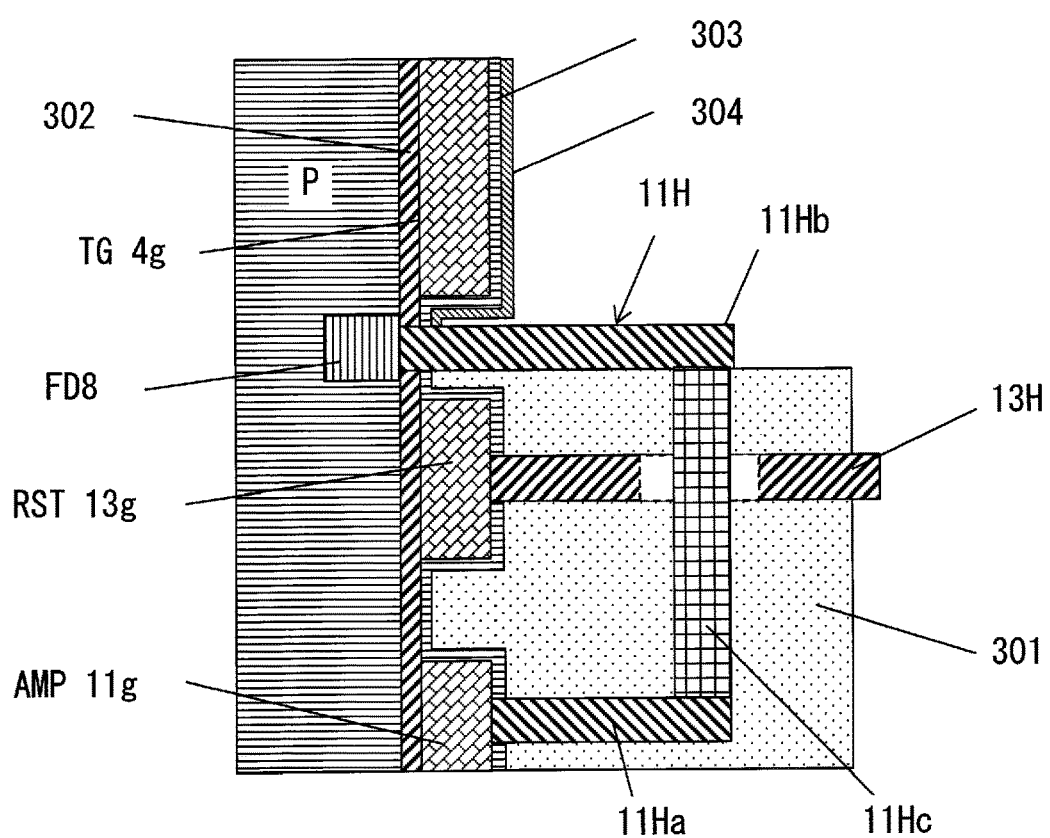

FIG. 12(*a*) is an enlarged view illustrating the periphery of the FD 8 and the amplification gate wiring 11H in FIG. 11(*a*). The same parts as those in FIG. 11 are denoted by the same reference signs in the description.

One side surface 202R of the protruding region 202TA of the semiconductor substrate 202 is provided with a gate oxide film 302, in which a transfer gate electrode 4*g*, a reset gate electrode 13*g*, and an amplification gate electrode 11*g* are formed. Surfaces of the transfer gate electrode 4*g*, the reset gate electrode 13*g*, and the amplification gate electrode 11*g* are covered with nitride films 303, 304. In FIG. 12(*a*), two layered nitride films 303, 304 are formed. One end of the amplification gate wiring 11H is connected to the amplification gate electrode 11*g* and the other end of the amplification gate wiring 11H is connected to the FD 8 through the nitride films 303 and 304 and the oxide film 302. A manufacturing process of the gate wiring 11H will now be described.

As illustrated in FIG. 12(*b*), the amplification gate wiring 11H includes first and second wirings 11Ha and 11Hb which are sequentially formed in an interlayer film 301 in a step not shown, and a wiring 11Hc which is formed in a via hole vertically passing through the oxide film 302. The reset gate wiring 13H connected to the reset gate electrode 13*g* is formed in the interlayer film 301 in a step (not shown).

1st to 4th Steps

The following figures illustrate and describe elements related to the process of forming the amplification gate wiring 11H in detail.

Figure 13:
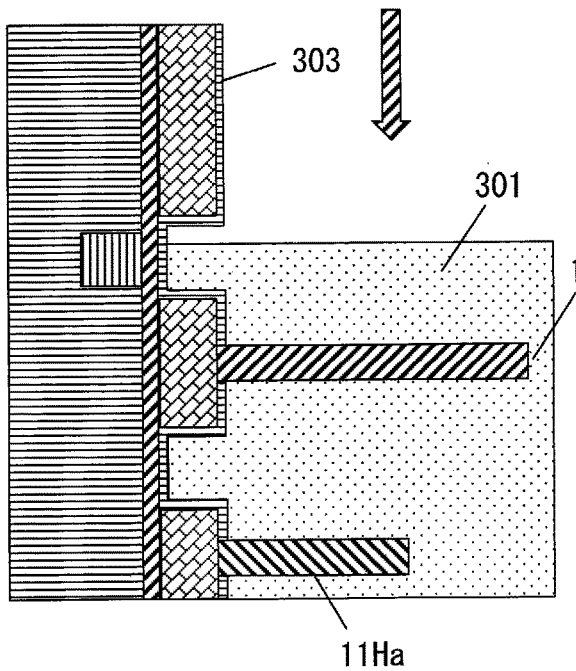
FIG. 13 is a view for explaining steps of the connecting part of the FD and the gate wiring 11H in the second embodiment.
Figure 13:
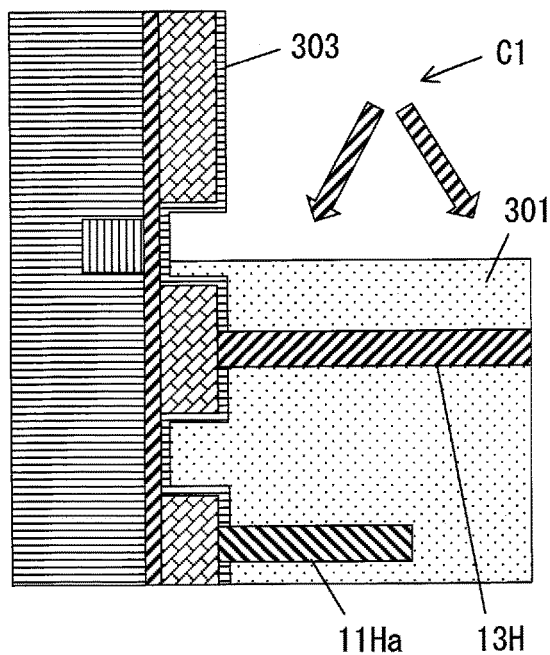
Figure 13:
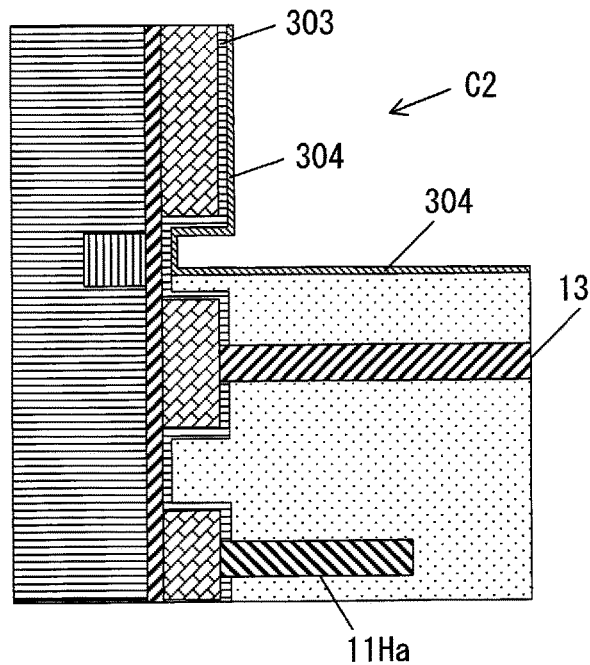
Figure 13:
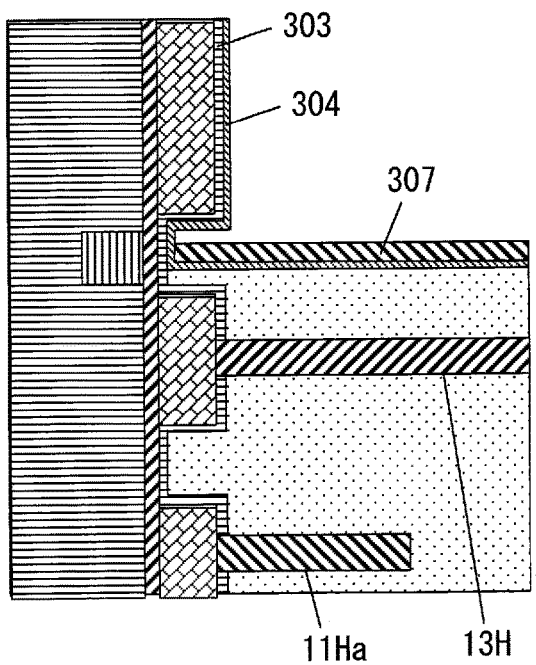
Figure 14:
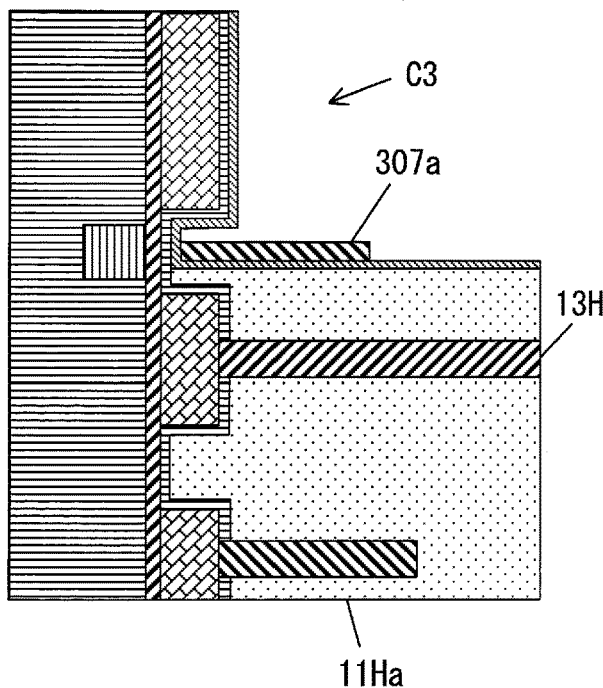
FIG. 14 is a view illustrating steps in the second embodiment, subsequent to the steps in FIG. 13.
Figure 14:
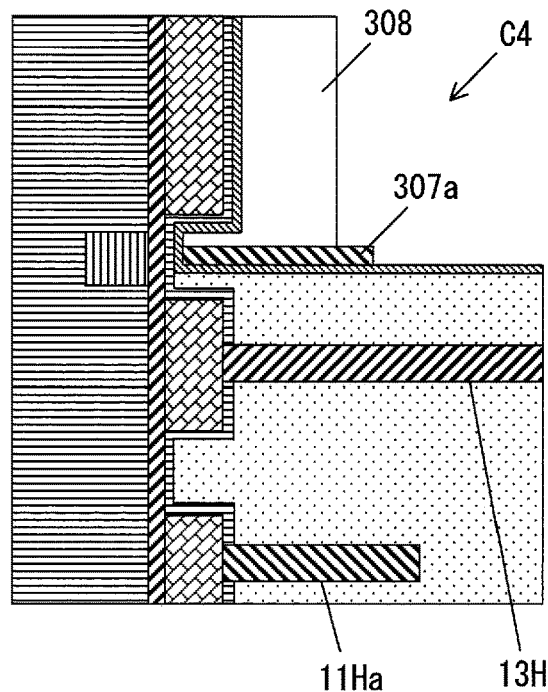
Figure 14:
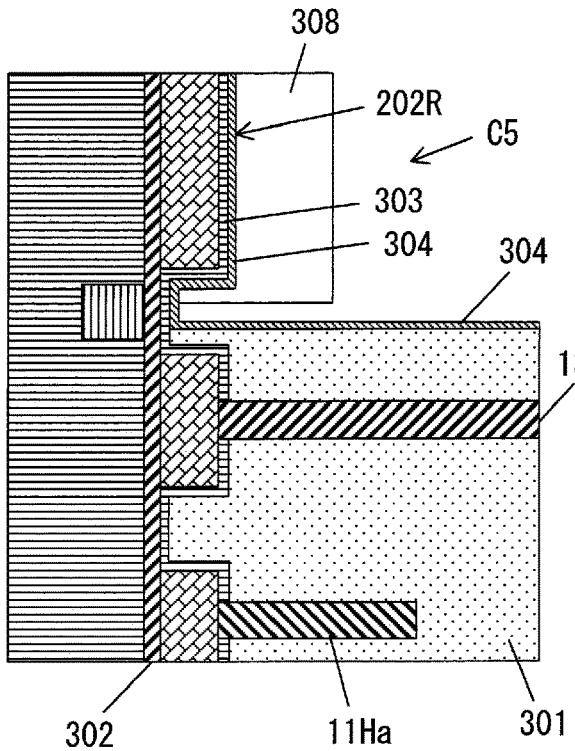
Figure 14:
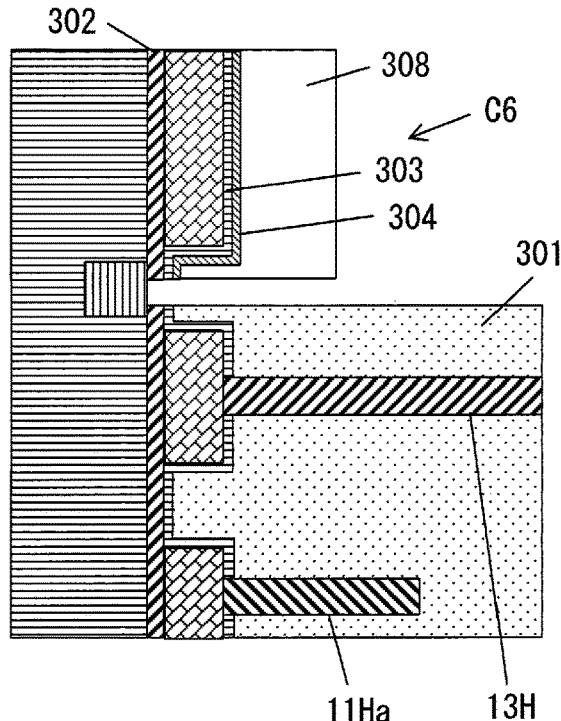
Figure 15:
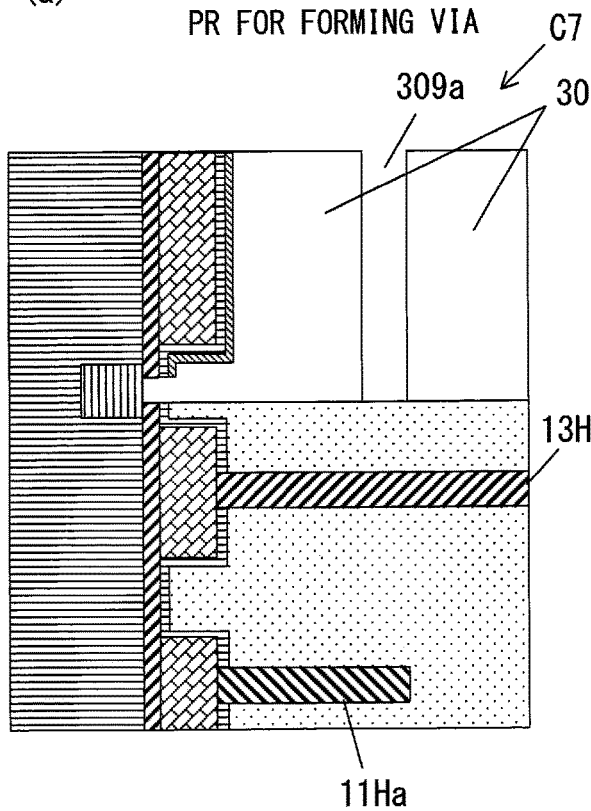
FIG. 15 is a view illustrating steps in the second embodiment, subsequent to the steps in FIG. 14.
Figure 15:
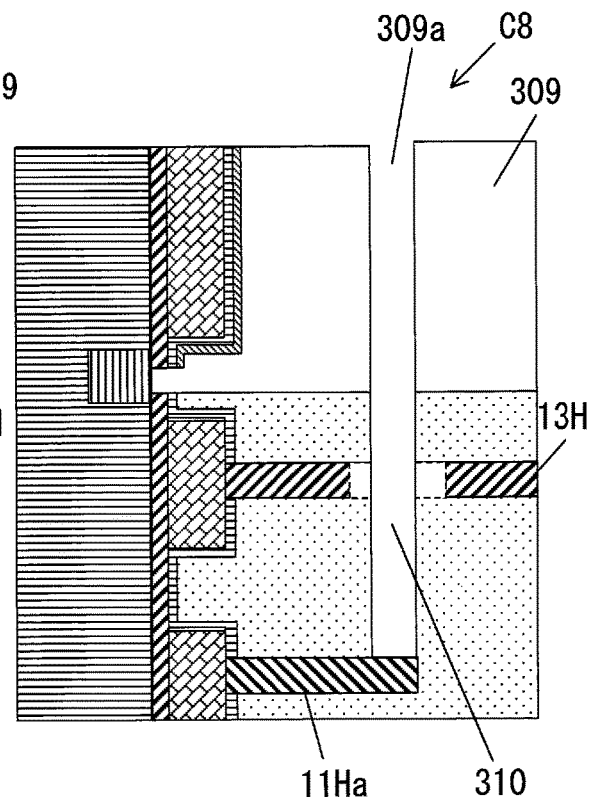
Figure 15:
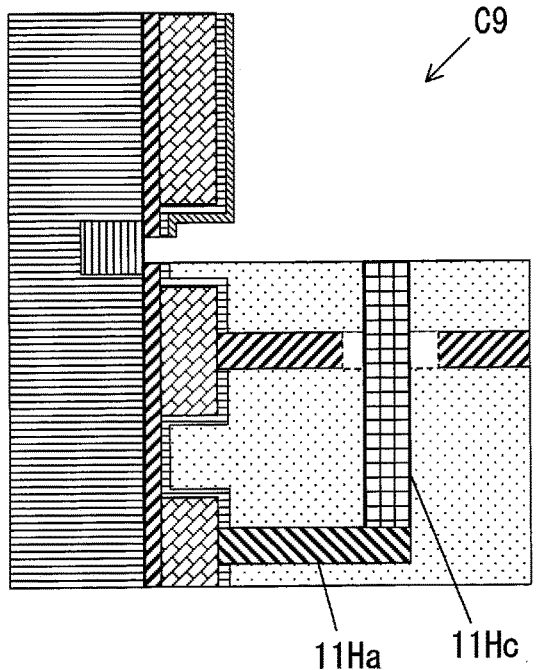
Figure 15:
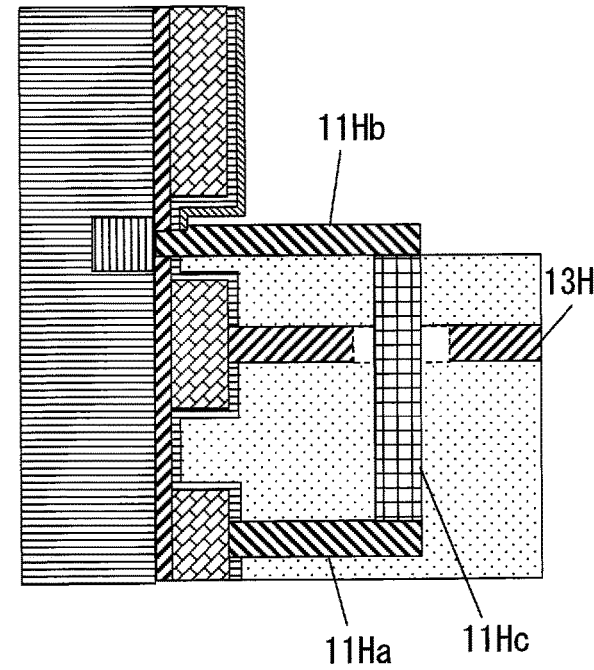

FIG. 13(*a*): The interlayer film 301 is etched back to a position illustrated in FIG. 12(*a*).

FIG. 13(*b*): The interlayer film 301 is further etched by isotropic etching.

FIG. 13(*c*): A thin nitride film 304 is deposited on a surface of an intermediate product C1 obtained in the step of FIG. 13(*b*).

FIG. 13(d): A thin SOG (Spin On Glass: SiO-based) 307 is coated on an intermediate product C2 obtained in the step of FIG. 13(c).

5th to 8th Steps

FIG. 14(a): The SOG 307 is patterned. Reference sign SOG 307a denotes the SOG after patterning.

FIG. 14(b): A resist is coated on an intermediate product C3 obtained in the step of FIG. 14(a) and patterned into a shape illustrated in FIG. 14(b). Reference sign 308 denotes the resist after patterning.

FIG. 14(c): An intermediate product C4 obtained in the step of FIG. 14(b) is subjected to wet etching, so that the SOG 307a after patterning is removed.

FIG. 14(d): An intermediate product C5 obtained in the step of FIG. 14(c) is subjected to wet etching so that the nitride film 304 on an upper surface of the interlayer film 301, the oxide film 302 and the nitride film 304 facing the FD 8 are removed. At this time, two layers of the nitride films 303 and the oxide film 304 of the side surface 202R are not removed since they are covered with the resist 308. Although the surface of the interlayer film 301 is also slightly etched during etching of the gate oxide film 302, this represents no problem since the gate oxide film 302 is thin (approximately 10 nm).

9th to 12th Steps

FIG. 15(a): The resist 308 of the intermediate product C6 obtained in the step of FIG. 14(d) is removed, newly coated by resist, and then patterned into a shape illustrated in FIG. 15(a). Reference sign 309 denotes the resist after patterning. A through hole 309a for etching is formed in the resist 309 in the substrate thickness direction.

FIG. 15(b): In an intermediate product C7 obtained in the step of FIG. 15(a), the interlayer film 301 is etched by an etching liquid flowing into the through hole 309a to form a hole 310 for wiring metal in the interlayer film 301.

FIG. 15(c): The resist 309 of the intermediate product C8 obtained in the step of FIG. 15(b) is removed and a metal material, for example, tungsten is vapor-deposited in the hole 310 for wiring metal to form the gate wiring 11Hc.

FIG. 15(d): A gate wiring 11Hb is formed in the intermediate product C9 obtained in the step of FIG. 15(c). The structure of FIG. 15(d) is the intermediate product illustrated in FIG. 12(a). This intermediate product is subjected to various processes to manufacture the solid-state image sensor 100A according to the second embodiment illustrated in FIG. 11.

The manufacturing method is meant only as an example, and various steps for manufacturing the solid-state image sensor 100A of FIG. 11 may be adopted.

The present invention is not limited to the embodiments and variations described above. Solid-state image sensors changed or modified in various ways without departing from the present invention are also encompassed within the scope of the present invention.

For example, the selection transistor 12 may also be provided in the protruding regions 202T, 202TA.

If the required performance of the image sensor can be achieved by comprehensively designing the quantum effect of the PD 1 and the capacity of the FD 8, the optical path area 400 may be omitted and light may enter from a surface of the PD 1 on the light receiving surface side.

Figure 16:
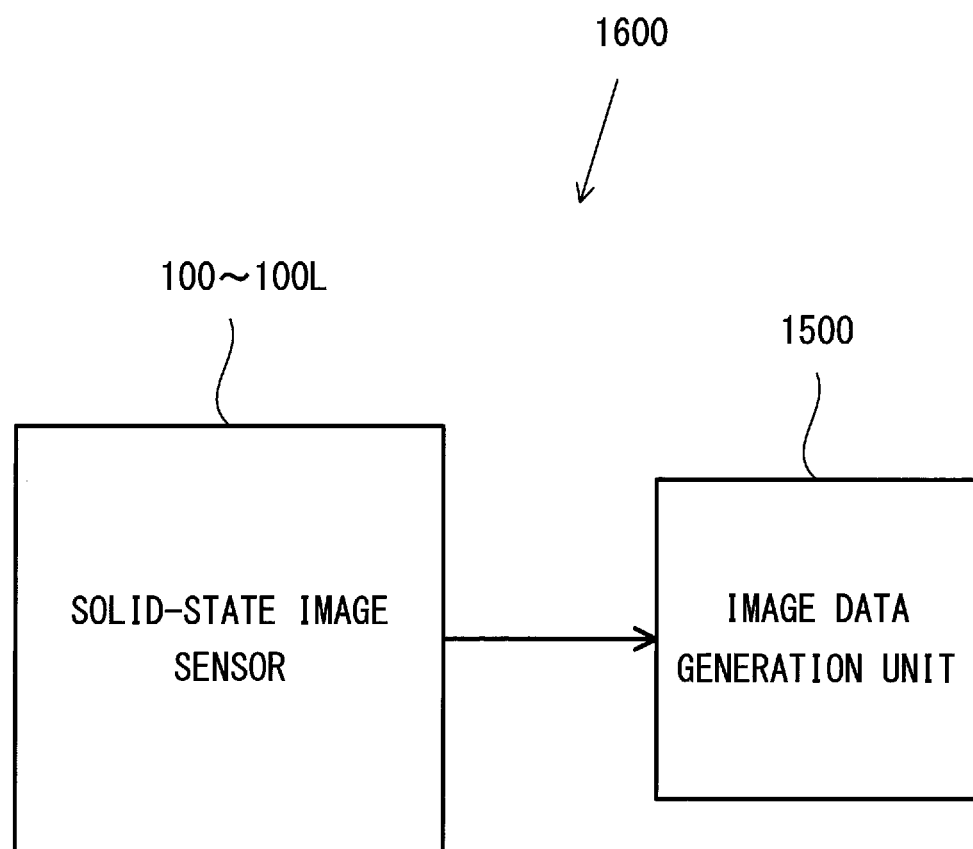
FIG. 16 is a block diagram illustrating an image-capturing device according to the present invention.

Further, as illustrated in FIG. 16, the present invention may be implemented as an image-capturing device 1600 including an image sensor 100 in one of the embodiments and variations described above and a generation unit 1500 that generates image data based on signals outputted from the image sensor 100.

The disclosure of the following priority application is herein incorporated by reference:
Japanese Patent Application No. 2015-195348 (filed Sep. 30, 2015)

REFERENCE SIGNS LIST

1 . . . photodiode, 1a . . . n-type photoelectric conversion region, 1b . . . p-type photoelectric conversion region, 1d, 1e . . . surface, 4 . . . transfer transistor, 4g . . . transfer gate electrode, 4H . . . transfer wiring, 8 . . . floating diffusion, 11 . . . amplification transistor, 11g . . . amplification gate electrode, 11H . . . amplification gate wiring, 11Ha, 11Hb, 11Hc . . . wiring elements constituting the amplification gate wiring, 12 . . . selection transistor, 13 . . . reset transistor, 13g . . . reset gate electrode, 13H . . . reset gate wiring, 20 . . . pixel, 21 . . . vertical signal line, 100, 100A . . . solid-state image sensor, 200 . . . semiconductor substrate, 201 . . . oxide region, 202 . . . semiconductor region, 203 . . . wiring region, 202K . . . base region, 202T . . . protruding region, 400 . . . optical path region, 401 . . . opening, 450, 452 . . . light shielding film, 451 . . . reflection film

The invention claimed is:

1. An image sensor, comprising:
a photoelectric conversion unit that photoelectrically converts light transmitted through a microlens;
an accumulation unit that accumulates an electric charge generated by the photoelectric conversion unit;
a light shielding unit that blocks light which enters the accumulation unit; and
a readout unit that reads out a signal based on a voltage of the accumulation unit, wherein:
a part of the photoelectric conversion unit is provided in the micro lens side of the light shielding unit along an optical axis of the microlens,
the accumulation unit and the readout unit are provided along an optical axis direction of the microlens,
the light shielding unit has an opening, and
at least a part of the photoelectric conversion unit passes through the opening.

2. The image sensor according to claim 1, further comprising:
an output unit that outputs a signal based on the voltage of the accumulation unit to the readout unit, wherein:
the output unit is provided between the accumulation unit and the readout unit with respect to the optical axis direction of the microlens.

3. The image sensor according to claim 2, wherein:
the output unit includes an electrode that provides a signal based on the accumulation unit to the readout unit.

4. The image sensor according to claim 1, wherein:
the photoelectric conversion unit, the accumulation unit, and the readout unit are provided along the optical axis direction of the microlens.

5. The image sensor according to claim 1, wherein:
the accumulation unit is provided between the photoelectric conversion unit and the readout unit with respect to the optical axis direction of the microlens.

6. The image sensor according to claim 1, wherein:
the photoelectric conversion unit photoelectrically converts the light transmitted through the microlens, between the microlens and the light shielding unit.

7. The image sensor according to claim 1, wherein:
the photoelectric conversion unit has a light receiving surface that receives light entered from a direction that intersects the optical axis of the microlens, between the microlens and the light shielding unit.

8. The image sensor according to claim 1, wherein:
the photoelectric conversion unit has a plurality of light receiving surfaces that receive light transmitted through the microlens, between the microlens and the light shielding unit.

9. The image sensor according to claim 1, wherein:
at least a part of the photoelectric conversion unit protrudes to the light incident side in comparison with the light shielding unit.

10. The image sensor according to claim 1, wherein:
the light shielding unit has an opening, and
at least a part of the photoelectric conversion unit protrudes from the opening beyond the light shielding unit to the light incident side.

11. The image sensor according to claim 1, further comprising:
a selection unit that selects a signal read by the readout unit, wherein:
the accumulation unit, the readout unit, and the selection unit are provided along the optical axis direction of the microlens.

12. The image sensor according to claim 11, wherein:
the readout unit is provided between the accumulation unit and the selection unit along the optical axis direction of the microlens.

13. An image-capturing device, comprising:
the image sensor according to claim 1; and
a generation unit that generates image data based on a signal outputted from the image sensor.

* * * * *